United States Patent
Gruening-von Schwerin et al.

(10) Patent No.: US 7,495,946 B2
(45) Date of Patent: *Feb. 24, 2009

(54) PHASE CHANGE MEMORY FABRICATED USING SELF-ALIGNED PROCESSING

(75) Inventors: Ulrike Gruening-von Schwerin, München (DE); Thomas Happ, Tarrytown, NY (US)

(73) Assignee: Infineon Technologies AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/366,706

(22) Filed: Mar. 2, 2006

(65) Prior Publication Data

US 2007/0230238 A1 Oct. 4, 2007

(51) Int. Cl.
*G11C 11/00* (2006.01)
(52) U.S. Cl. ........................ 365/148; 365/163
(58) Field of Classification Search ................ 365/148, 365/163, 34
See application file for complete search history.

(56) References Cited

U.S. PATENT DOCUMENTS

| | | | | |
|---|---|---|---|---|
| 5,838,038 | A * | 11/1998 | Takashima et al. | 257/301 |
| 6,194,759 | B1 * | 2/2001 | Sano et al. | 257/314 |
| 6,545,903 | B1 * | 4/2003 | Wu | 365/148 |
| 6,579,760 | B1 | 6/2003 | Lung | |
| 6,750,101 | B2 | 6/2004 | Lung | |
| 6,853,591 | B2 * | 2/2005 | Schreck | 365/189.07 |
| 6,894,305 | B2 * | 5/2005 | Yi et al. | 257/4 |
| 7,208,751 | B2 * | 4/2007 | Ooishi | 257/5 |
| 7,324,365 | B2 * | 1/2008 | Schwerin et al. | 365/148 |
| 2004/0051094 | A1 | 3/2004 | Qoishi | |
| 2005/0036364 | A1 * | 2/2005 | Ha et al. | 365/163 |
| 2005/0242338 | A1 | 11/2005 | Hart et al. | |
| 2007/0099377 | A1 * | 5/2007 | Happ et al. | 438/257 |

FOREIGN PATENT DOCUMENTS

| | | |
|---|---|---|
| CN | 1495904 | 5/2004 |
| CN | 1702883 | 11/2005 |
| DE | 10 2004 014 487 A1 | 11/2005 |

OTHER PUBLICATIONS

S.J. Ahn et al., "Highly Manufacturable High Density Phase Change Memory of 64 Mb and Beyond", IEDM 2004.
H. Horrii et al., "A Novel Cell Technology Using N-doped GeSbTe Films for Phase Change RAM", VLSI, 2003.
Y.N. Hwang et al., "Full Integration and Reliability Evaluation of Phase-change RAM Based on 0.24 μm-CMOS Technologies", VLSI, 2003.
Stefan Lai et al., "OUM—A 180 nm Nonvolatile Memory Cell Element Technology For Stand Alone and Embedded Applications", IEDM, 2001.
Y.H. Ha et al., "An Edge Contact Type Cell for Phase Change RAM Featuring Very Low Power Consumption", VLSI, 2003.
F. Pellizzer et al., "Novel μTrench Phase-Change Memory Cell for Embedded and Stand-Alone Non-Volatile Memory Applications", VLSI, 2004.
"Chinese Office Action mailed Aug. 29, 2008".

* cited by examiner

*Primary Examiner*—Tan T. Nguyen
(74) *Attorney, Agent, or Firm*—Dicke, Billig & Czaja, PLLC

(57) ABSTRACT

A memory includes transistors in rows and columns providing an array and conductive lines in columns across the array. The memory includes phase change elements contacting the conductive lines and self-aligned to the conductive lines. Each phase change element is coupled to one side of a source-drain path of a transistor.

13 Claims, 20 Drawing Sheets

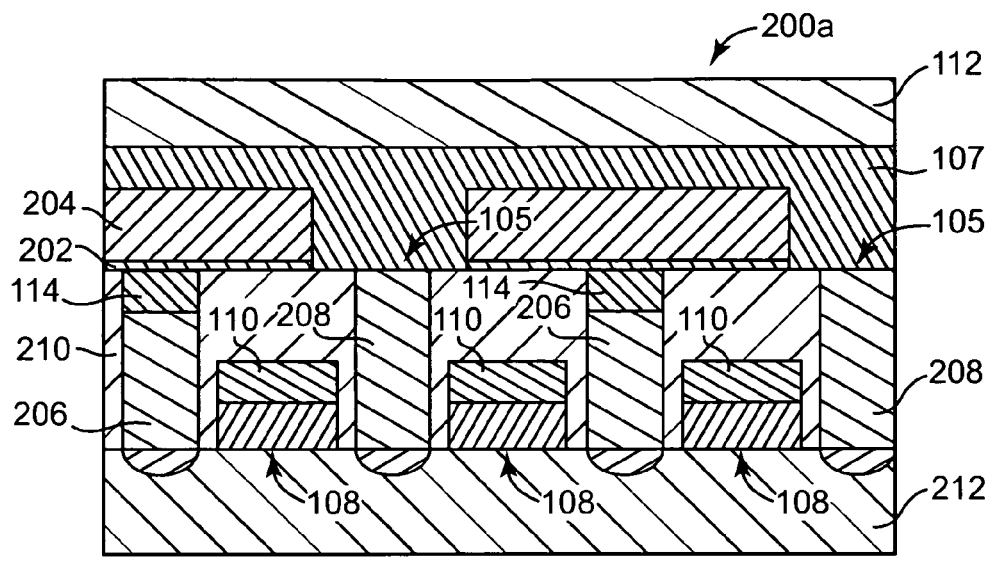
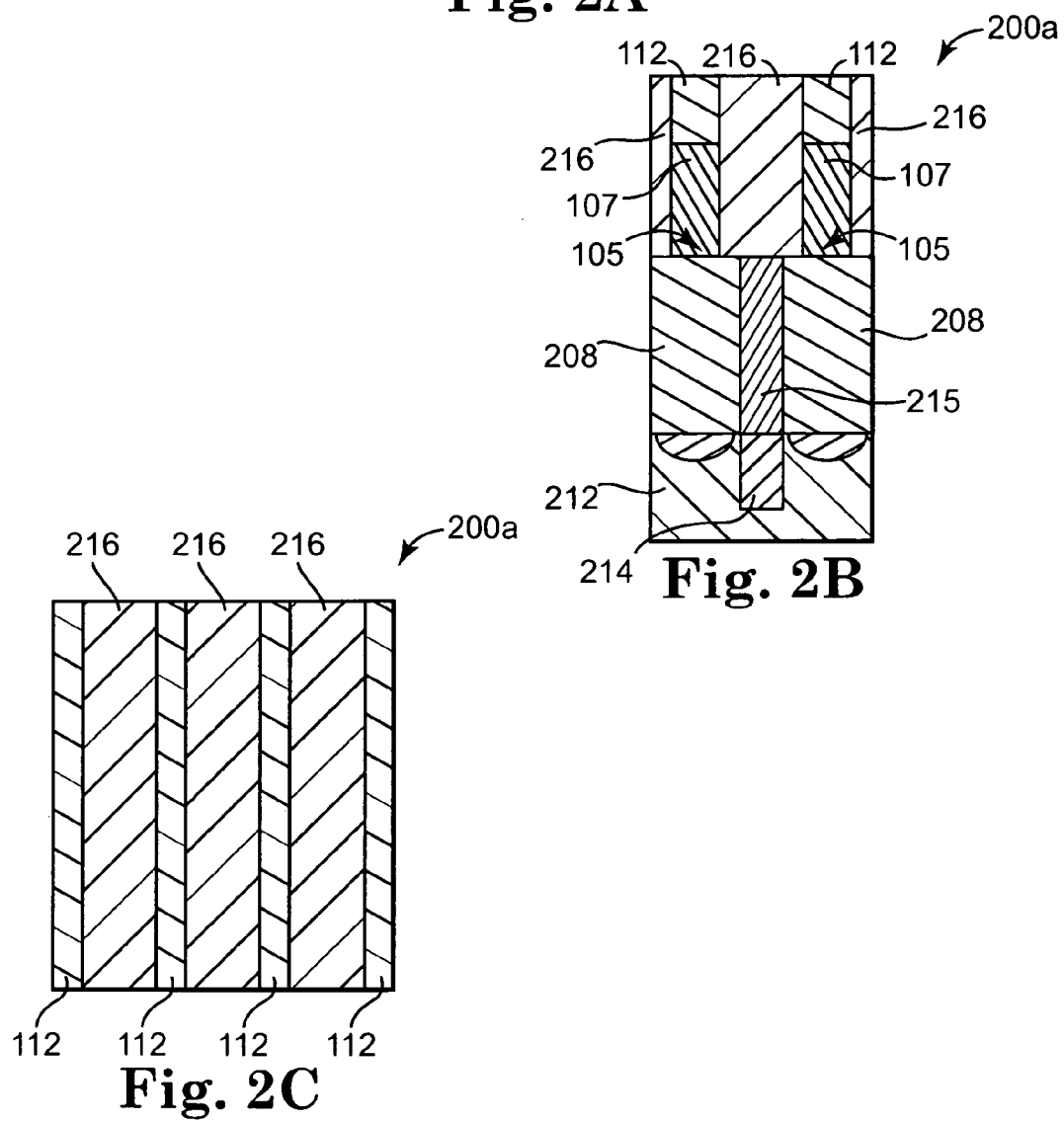
Fig. 2A
Fig. 2B
Fig. 2C

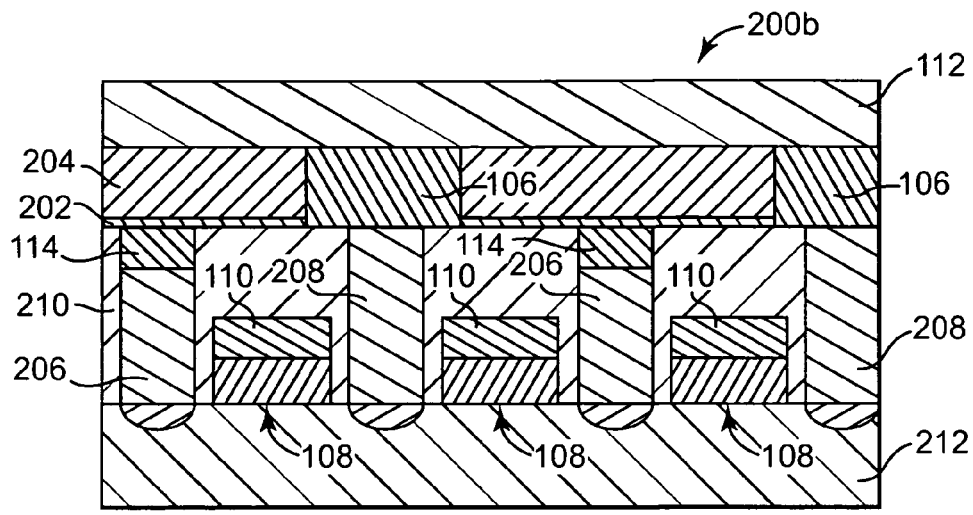
Fig. 9A
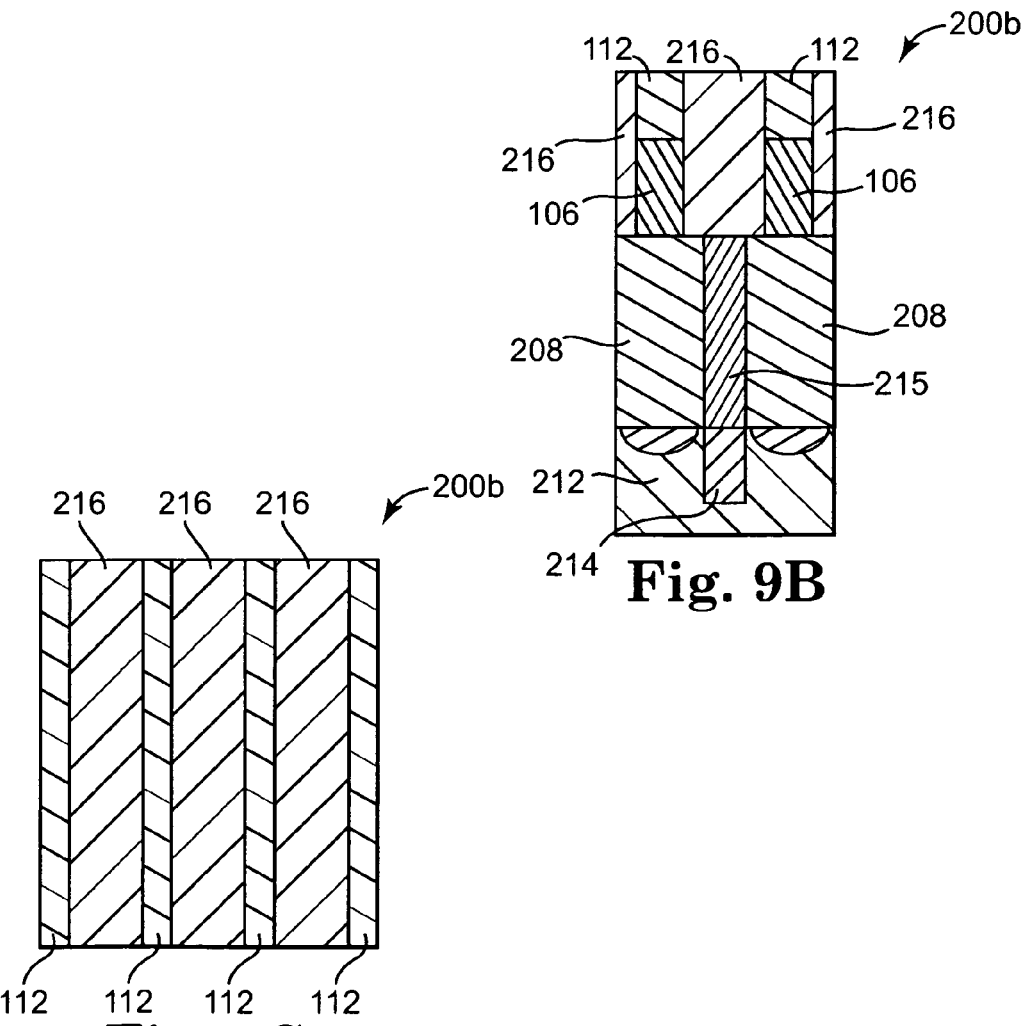
Fig. 9B
Fig. 9C

PHASE CHANGE MEMORY FABRICATED USING SELF-ALIGNED PROCESSING

CROSS-REFERENCE TO RELATED APPLICATIONS

This application is related to U.S. patent application Ser. No. 11/366,151, entitled "PHASE CHANGE MEMORY FABRICATED USING SELF-ALIGNED PROCESSING", now U.S. Pat. No. 7,362,608, and U.S. patent application Ser. No. 11/366,370, entitled "PHASE CHANGE MEMORY FABRICATED USING SELF-ALIGNED PROCESSING," now U.S. Pat. No. 7,324,365, both filed concurrently on the same day with the present application and both incorporated herein by reference.

BACKGROUND

One type of non-volatile memory is resistive memory. Resistive memory utilizes the resistance value of a memory element to store one or more bits of data. For example, a memory element programmed to have a high resistance value may represent a logic "1" data bit value, and a memory element programmed to have a low resistance value may represent a logic "0" data bit value. The resistance value of the memory element is switched electrically by applying a voltage pulse or a current pulse to the memory element. One type of resistive memory is phase change memory. Phase change memory uses a phase change material for the resistive memory element.

Phase change memories are based on phase change materials that exhibit at least two different states. Phase change material may be used in memory cells to store bits of data. The states of phase change material may be referred to as amorphous and crystalline states. The states may be distinguished because the amorphous state generally exhibits higher resistivity than does the crystalline state. Generally, the amorphous state involves a more disordered atomic structure, while the crystalline state involves a more ordered lattice. Some phase change materials exhibit more than one crystalline state, e.g. a face-centered cubic (FCC) state and a hexagonal closest packing (HCP) state. These two crystalline states have different resistivities and may be used to store bits of data.

Phase change in the phase change materials may be induced reversibly. In this way, the memory may change from the amorphous state to the crystalline state and from the crystalline state to the amorphous state in response to temperature changes. The temperature changes to the phase change material may be achieved in a variety of ways. For example, a laser can be directed to the phase change material, current may be driven through the phase change material, or current can be fed through a resistive heater adjacent the phase change material. In any of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

For data storage applications, reducing the physical memory cell size is a continuing goal. Reducing the physical memory cell size increases the storage density of the memory and reduces the cost of the memory. To reduce the physical memory cell size, the memory cell layout should be lithography friendly. In addition, since interface resistances between metal and active material within memory cells contributes considerably to the overall resistance for small areas, the interface areas should be well controlled. Finally, the memory cell layout should have mechanical stability to improve the chemical mechanical planarization (CMP) process window to enable greater yields.

For these and other reasons, there is a need for the present invention.

SUMMARY

One embodiment of the present invention provides a memory. The memory includes transistors in rows and columns providing an array and conductive lines in columns across the array. The memory includes phase change elements contacting the conductive lines and self-aligned to the conductive lines. Each phase change element is coupled to one side of a source-drain path of a transistor.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2A illustrates a cross-sectional view of one embodiment of an array of phase change memory cells.

FIG. 2B illustrates a perpendicular cross-sectional view of the array of phase change memory cells illustrated in FIG. 2A.

FIG. 2C illustrates a top view of the array of phase change memory cells illustrated in FIG. 2A.

FIG. 9A illustrates a cross-sectional view of another embodiment of an array of phase change memory cells.

FIG. 9B illustrates a perpendicular cross-sectional view of the array of phase change memory cells illustrated in FIG. 9A.

FIG. 9C illustrates a top view of the array of phase change memory cells illustrated in FIG. 9A.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
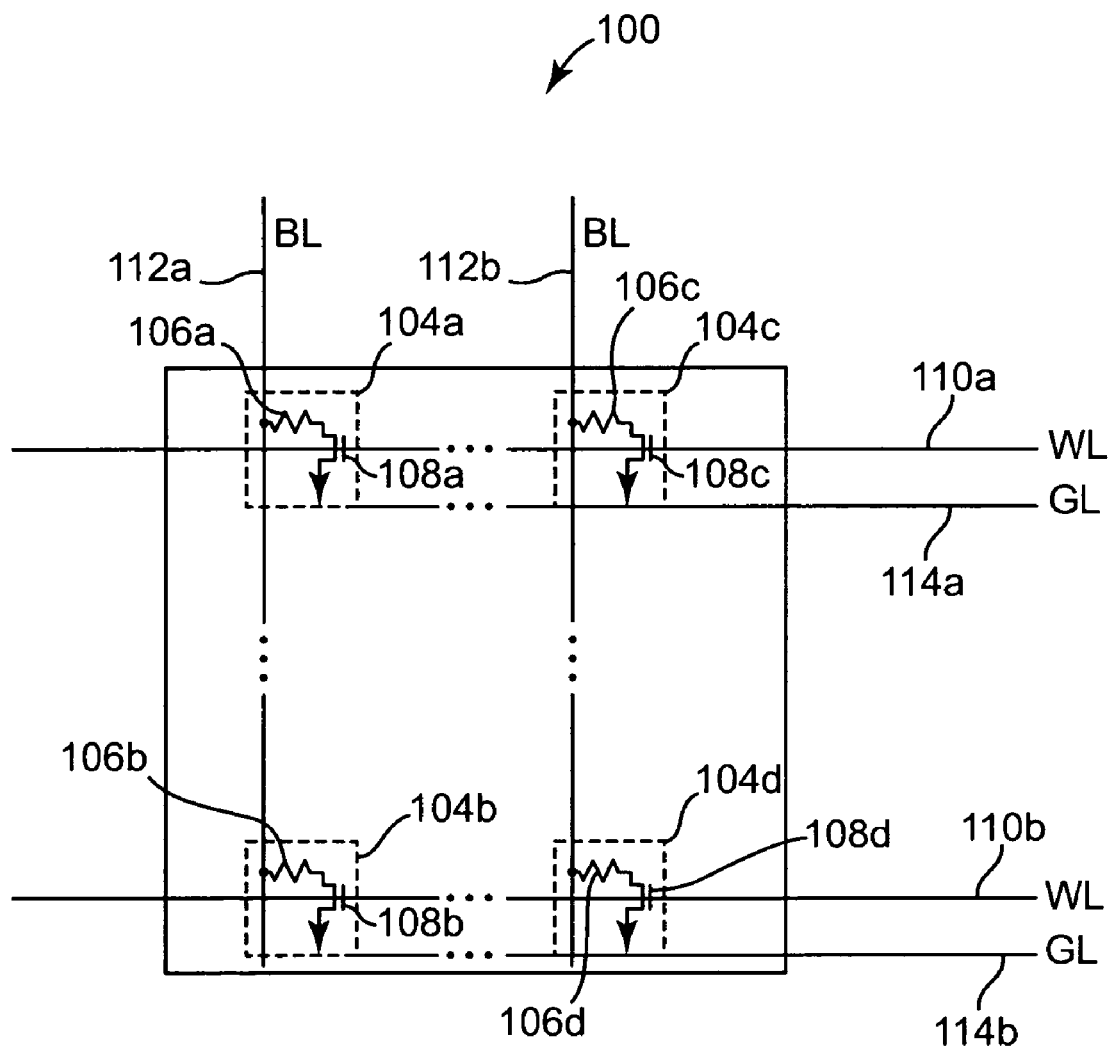
FIG. 1 is a diagram illustrating one embodiment of an array of phase change memory cells.

FIG. 1 is a diagram illustrating one embodiment of an array of phase-change memory cells 100. Memory array 100 is fabricated using line lithography and self-aligned processing to minimize critical lithography steps. In addition, the interface resistance between metal and active material is overlay-insensitive and by maximizing the interface areas, parasitic resistances are minimized. Memory array 100 does not have any isolated, small patterns such that the chemical mechanical planarization (CMP) process window is improved and mechanical stability is improved.

Memory array 100 includes a plurality of phase-change memory cells 104a-104d (collectively referred to as phase-change memory cells 104), a plurality of bit lines (BLs) 112a-112b (collectively referred to as bit lines 112), a plurality of word lines (WLs) 110a-110b (collectively referred to as word lines 110), and a plurality of ground lines (GLs) 114a-114b (collectively referred to as ground lines 114).

As used herein, the term "electrically coupled" is not meant to mean that the elements must be directly coupled together and intervening elements may be provided between the "electrically coupled" elements.

Each phase-change memory cell 104 is electrically coupled to a word line 110, a bit line 112, and a ground line 114. For example, phase-change memory cell 104a is electrically coupled to bit line 112a, word line 110a, and ground line 114a, and phase-change memory cell 104b is electrically coupled to bit line 112a, word line 110b, and ground line 114b. Phase-change memory cell 104c is electrically coupled to bit line 112b, word line 110a, and ground line 114a, and phase-change memory cell 104d is electrically coupled to bit line 112b, word line 110b, and ground line 114b.

Each phase-change memory cell 104 includes a phase-change element 106 and a transistor 108. While transistor 108 is a field-effect transistor (FET) in the illustrated embodiment, in other embodiments, transistor 108 can be another suitable device such as a bipolar transistor or a 3D transistor structure. Phase-change memory cell 104a includes phase-change element 106a and transistor 108a. One side of phase-change element 106a is electrically coupled to bit line 112a, and the other side of phase-change element 106a is electrically coupled to one side of the source-drain path of transistor 108a. The other side of the source-drain path of transistor 108a is electrically coupled to ground line 114a. The gate of transistor 108a is electrically coupled to word line 110a. Phase-change memory cell 104b includes phase-change element 106b and transistor 108b. One side of phase-change element 106b is electrically coupled to bit line 112a, and the other side of phase-change element 106b is electrically coupled to one side of the source-drain path of transistor 108b. The other side of the source-drain path of transistor 108b is electrically coupled to ground line 114b. The gate of transistor 108b is electrically coupled to word line 110b.

Phase-change memory cell 104c includes phase-change element 106c and transistor 108c. One side of phase-change element 106c is electrically coupled to bit line 112b and the other side of phase-change element 106c is electrically coupled to one side of the source-drain path of transistor 108c. The other side of the source-drain path of transistor 108c is electrically coupled to ground line 114a. The gate of transistor 108c is electrically coupled to word line 110a. Phase-change memory cell 104d includes phase-change element 106d and transistor 108d. One side of phase-change element 106d is electrically coupled to bit line 112b and the other side of phase-change element 106d is electrically coupled to one side of the source-drain path of transistor 108d. The other side of the source-drain path of transistor 108d is electrically coupled to ground line 114b. The gate of transistor 108d is electrically coupled to word line 110b.

In another embodiment, each phase-change element 106 is electrically coupled to a ground line 114 and each transistor 108 is electrically coupled to a bit line 112. For example, for phase-change memory cell 104a, one side of phase-change element 106a is electrically coupled to ground line 114a. The other side of phase-change element 106a is electrically coupled to one side of the source-drain path of transistor 108a. The other side of the source-drain path of transistor 108a is electrically coupled to bit line 112a. In general, the ground lines 114 have a lower potential than the bit lines 112.

Each phase-change element 106 comprises a phase-change material that may be made up of a variety of materials in accordance with the present invention. Generally, chalcogenide alloys that contain one or more elements from group VI of the periodic table are useful as such materials. In one embodiment, the phase-change material of phase-change element 106 is made up of a chalcogenide compound material, such as GeSbTe, SbTe, GeTe or AgInSbTe. In another embodiment, the phase-change material is chalcogen free, such as GeSb, GaSb, InSb, or GeGaInSb. In other embodiments, the phase-change material is made up of any suitable material including one or more of the elements Ge, Sb, Te, Ga, As, In, Se, and S.

During a set operation of phase-change memory cell 104a, a set current or voltage pulse is selectively enabled and sent through bit line 112a to phase-change element 106a thereby heating it above it's crystallization temperature (but usually below it's melting temperature) with word line 110a selected to activate transistor 108a. In this way, phase-change element 106a reaches its crystalline state during this set operation. During a reset operation of phase-change memory cell 104a, a reset current or voltage pulse is selectively enabled to bit line 112a and sent to phase-change material element 106a. The reset current or voltage quickly heats phase-change element 106a above its melting temperature. After the current or voltage pulse is turned off, the phase-change element 106a quickly quench cools into the amorphous state. Phase-change memory cells 104b-104d and other phase-change memory cells 104 in memory array 100 are set and reset similarly to phase-change memory cell 104a using a similar current or voltage pulse.

FIG. 2A illustrates a cross-sectional view of one embodiment of an array of phase change memory cells 200a. FIG. 2B illustrates a perpendicular cross-sectional view of array of phase change memory cells 200a illustrated in FIG. 2A. FIG. 2C illustrates a top view of array of phase change memory cells 200a illustrated in FIG. 2A. In one embodiment, array of phase change memory cells 100 is similar to array of phase change memory cells 200a. Array of phase change memory cells 200a includes substrate 212, transistors 108, word lines 110, first contacts 206, second contacts 208, ground lines 114, optional liner material 202, dielectric material 204, 210, and 216, shallow trench isolation (STI) 214, inter level dielectric (ILD) 215, phase change material 107, and bits lines 112. Metal wiring (not shown) follows after the bit line level.

Transistors 108 for selecting storage locations 105 in phase change material 107 are formed in substrate 212 in rows and columns. The gates of transistors 108 are electrically coupled to word lines 110. Dielectric material 210 is deposited over transistors 108 and word lines 110. First contacts 206 electrically couple one side of the source-drain path of each transistor 108 to a ground line 114. Second contacts 208 electrically couple the other side of the source-drain path of each transistor 108 to a storage location 105, which is a part of phase change material 107. Each line of phase change material 107 is electrically coupled to a bit line 112. Bit lines 112 are perpendicular to word lines 110 and ground lines 114. Liner material 202 and dielectric material 204 insulate ground lines 114 above first contacts 206. Dielectric material 216 insulates bits lines 112 and lines of phase change material 107 from adjacent bit lines 112 and lines of phase change material 107. STI 214 insulates transistors 108 from adjacent transistors 108, and ILD 215 insulates second contacts 208 from adjacent second contacts 208.

Lines of phase change material 107, which include storage locations 105, are self-aligned to bit lines 112. The self-alignment minimizes critical lithography steps in the fabrication of array of phase change memory cells 200a. In addition, with self-alignment the interface resistances between second contacts 208 and phase change material 107 and between phase change material 107 and bit lines 112 is overlay insensitive and parasitic resistances are minimized.

In one embodiment, array of phase change memory cells 200a is scalable to 8 $F^2$ for dual gate memory cells, where "F" is the minimum feature size, or to 6 $F^2$ for single gate memory cells. In the embodiment for single gate memory cells, an active gate of a transistor 108 between every two adjacent memory cells is replaced with an isolation gate (i.e., the transistor is not used as a switch; rather it is always turned off). One embodiment of a method for fabricating array of phase change memory cells 200a is described and illustrated with reference to the following FIGS. 3A-8B.

Figure 3A:
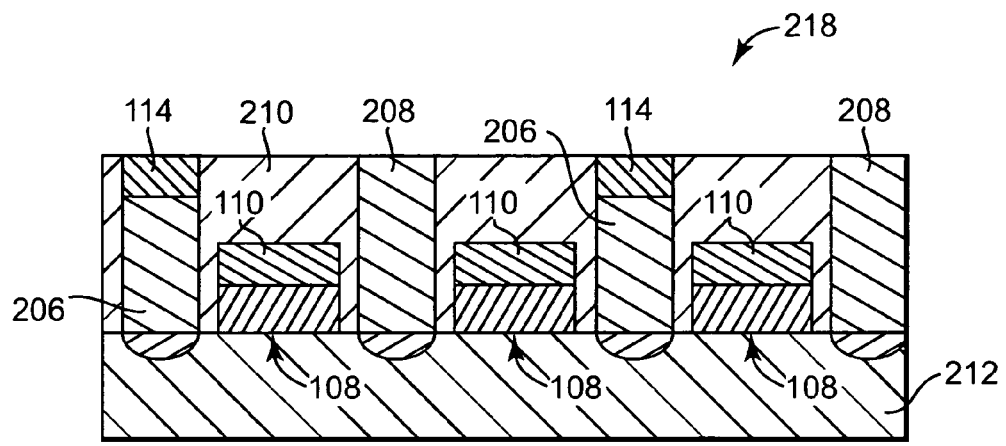
FIG. 3A illustrates a cross-sectional view of one embodiment of a preprocessed wafer.
Figure 3B:
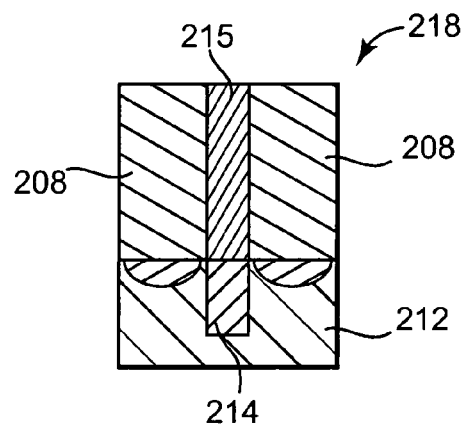
FIG. 3B illustrates a perpendicular cross-sectional view of the preprocessed wafer illustrated in FIG. 3A.
Figures 3C, 3D:
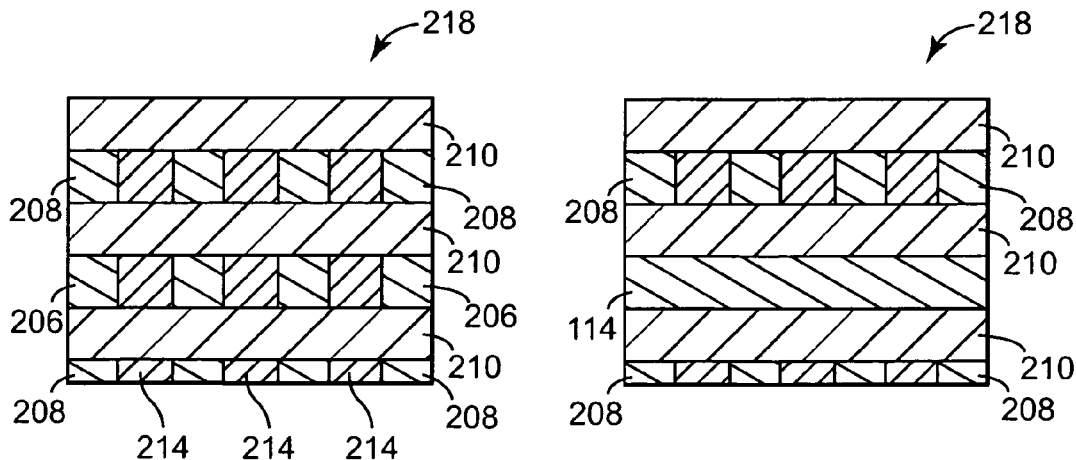
FIG. 3C illustrates a top cross-sectional view of the preprocessed wafer illustrated in FIG. 3A.
FIG. 3D illustrates a top view of the preprocessed wafer illustrated in FIG. 3A.

FIG. 3A illustrates a cross-sectional view of one embodiment of a preprocessed wafer 218. FIG. 3B illustrates a perpendicular cross-sectional view of preprocessed wafer 218 illustrated in FIG. 3A. FIG. 3C illustrates a top cross-sectional view of preprocessed wafer 218 illustrated in FIG. 3A. FIG. 3D illustrates a top view of preprocessed wafer 218 illustrated in FIG. 3A. Preprocessed wafer 218 includes substrate 212, transistors 108, word lines 110, first contacts 206, second contacts 208, ground lines 114, STI 214, ILD 215, and dielectric material 210.

Transistors 108 are formed in substrate 212 in rows and columns. The gates of transistors 108 are electrically coupled to word lines 110. Dielectric material 210 is deposited over transistors 108 and word lines 110. First contacts 206 electrically couple one side of the source-drain path of each transistor 108 to a ground line 114. Second contacts 208 are electrically coupled to the other side of the source-drain path of each transistor 108. STI 214 insulates transistors 108 from adjacent transistors 108, and ILD 215 insulates second contacts 208 from adjacent second contacts 208.

First contacts 206 and second contacts 208 are contact plugs, such as W plugs, Cu plugs, or other suitable conducting material plugs. Word lines 110 comprise doped poly-Si, W, TiN, NiSi, CoSi, TiSi, $WSi_x$, or another suitable material. Ground lines 114 comprise W, Al, Cu, or other suitable material. Dielectric material 210 comprises SiN or other suitable material that enables a borderless contact formation process for first contacts 206 and second contacts 208. STI 214 and IMD 215 comprise $SiO_2$, fluorinated silica glass (FSG), borophosphorous silicate glass (BPSG), boro-silicate glass (BSG), or other suitable dielectric material. Word lines 110 are parallel to ground lines 114. Word lines 110 and ground lines 114 are perpendicular to STI 214 and ILD 215.

Figure 4A:
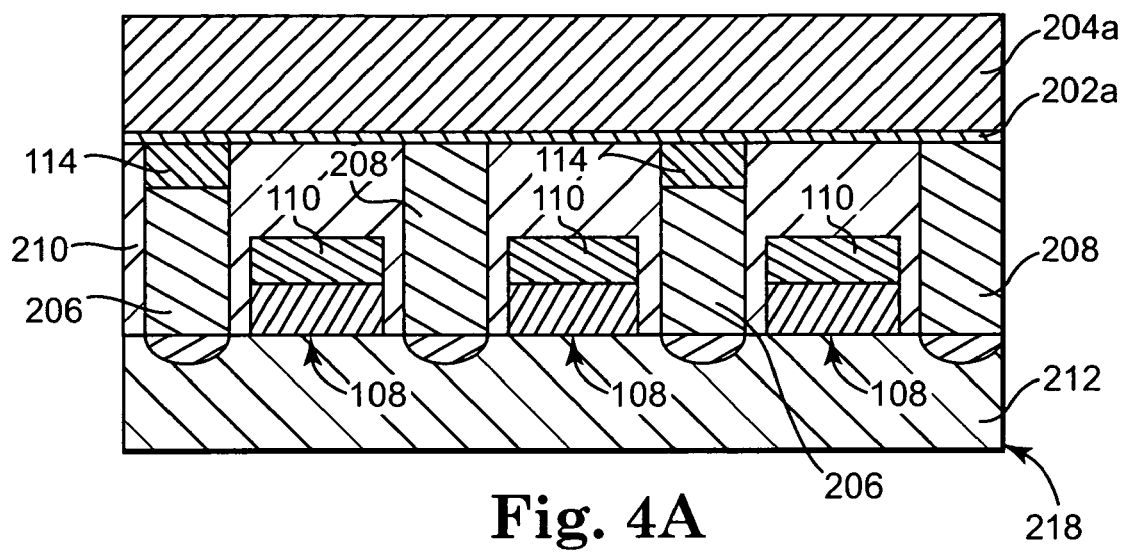
FIG. 4A illustrates a cross-sectional view of one embodiment of the preprocessed wafer, a liner material layer, and a dielectric material layer.
Figure 4B:
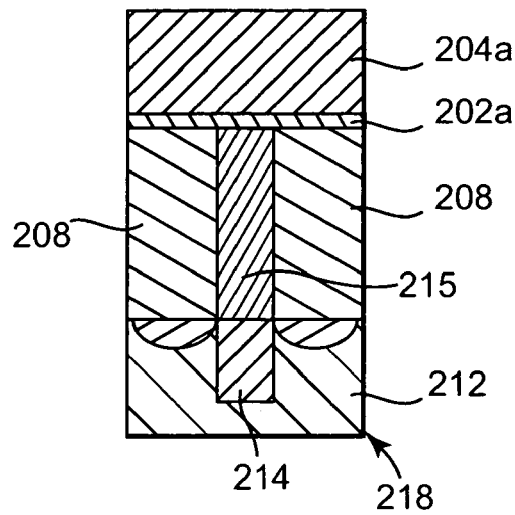
FIG. 4B illustrates a perpendicular cross-sectional view of the wafer illustrated in FIG. 4A.

FIG. 4A illustrates a cross-sectional view of one embodiment of preprocessed wafer 218, an optional liner material layer 202a, and a dielectric material layer 204a. FIG. 4B illustrates a perpendicular cross-sectional view of the wafer illustrated in FIG. 4A. Liner material, such as SiN, SiON, or other suitable liner material, is optionally deposited over preprocessed wafer 218 to provide liner material layer 202a. Liner material layer 202a is deposited using chemical vapor deposition (CVD), atomic layer deposition (ALD), metal organic chemical vapor deposition (MOCVD), plasma vapor deposition (PVD), jet vapor deposition (JVP), high-density plasma (HDP), or other suitable deposition technique.

Dielectric material, such as $SiO_2$, FSG, BPSG, BSG, or other suitable dielectric material, is deposited over liner material layer 202a to provide dielectric material layer 204a. Dielectric material layer 204a is deposited using CVD, ALD, MOCVD, PVD, JVP, HDP, or other suitable deposition technique.

Figure 5A:
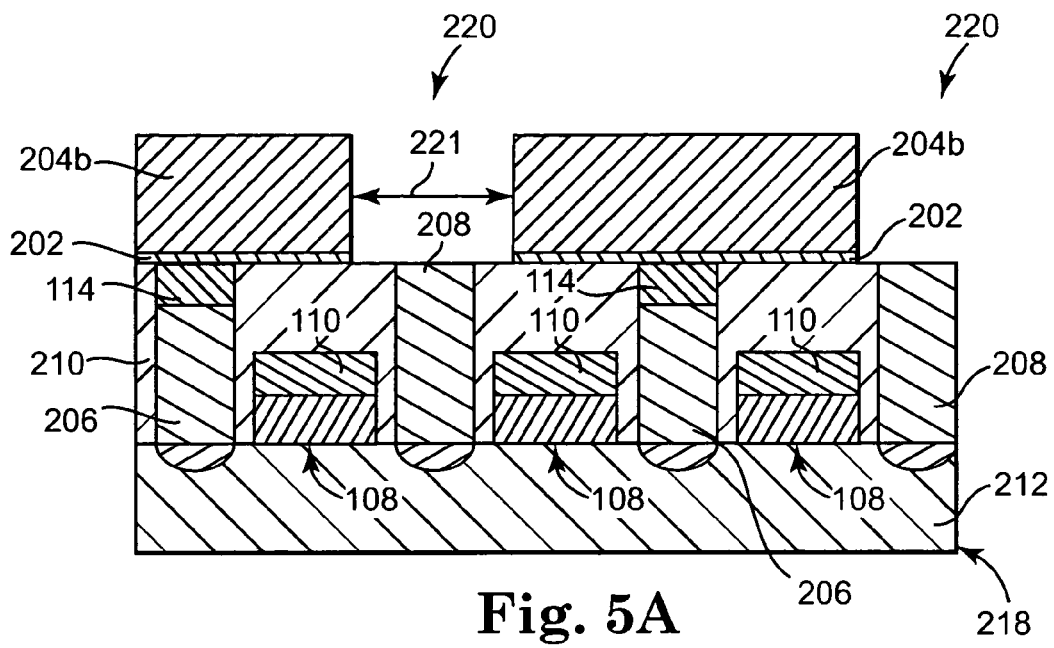
FIG. 5A illustrates a cross-sectional view of one embodiment of the preprocessed wafer, liner material layer, and dielectric material layer after etching.
Figure 5B:
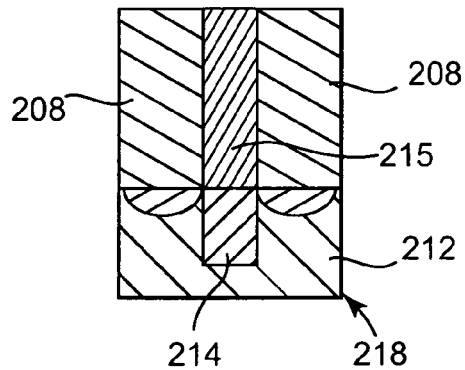
FIG. 5B illustrates a perpendicular cross-sectional view of the wafer illustrated in FIG. 5A.
Figure 5C:
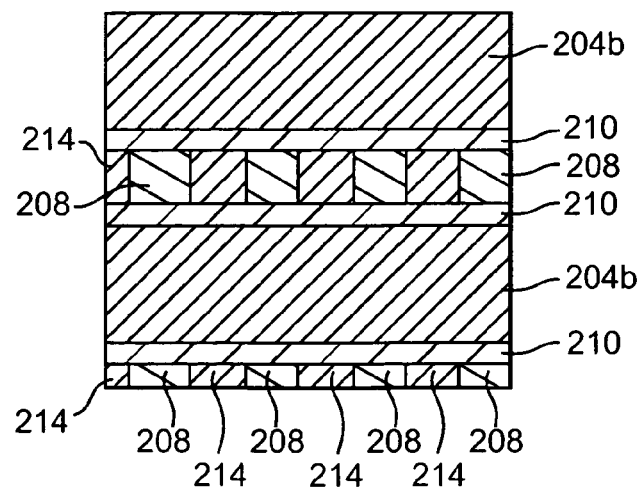
FIG. 5C illustrates a top view of the wafer illustrated in FIG. 5A.

FIG. 5A illustrates a cross-sectional view of one embodiment of preprocessed wafer 218, optional liner material layer 202, and dielectric material layer 204b after etching dielectric material layer 204a and liner material layer 202a. FIG. 5B illustrates a perpendicular cross-sectional view of the wafer illustrated in FIG. 5A, and FIG. 5C illustrates a top view of the wafer illustrated in FIG. 5A. Dielectric material layer 204a and liner material layer 202a are etched to provide dielectric material layer 204b and liner material layer 202 to form trenches 220. Line lithography is used to pattern trenches 220 having a width 221 to expose second contacts 208. In one embodiment, width 221 is less than the width of second contact 208. The line lithography does not need to be precisely centered over second contacts 208 as long as second contacts 208 are exposed. In this way, the line lithography is less critical yet the desired memory cell size is obtained.

Figure 6A:
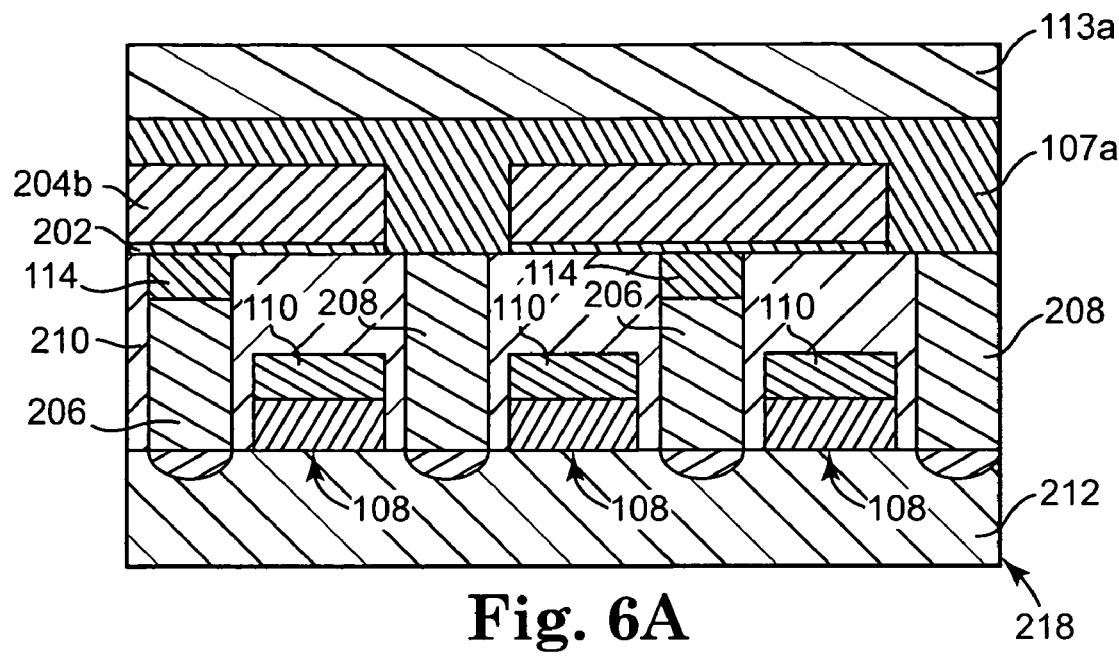
FIG. 6A illustrates a cross-sectional view of one embodiment of the preprocessed wafer, liner material layer, dielectric material layer, a phase change material layer, and an electrode material layer.
Figure 6B:
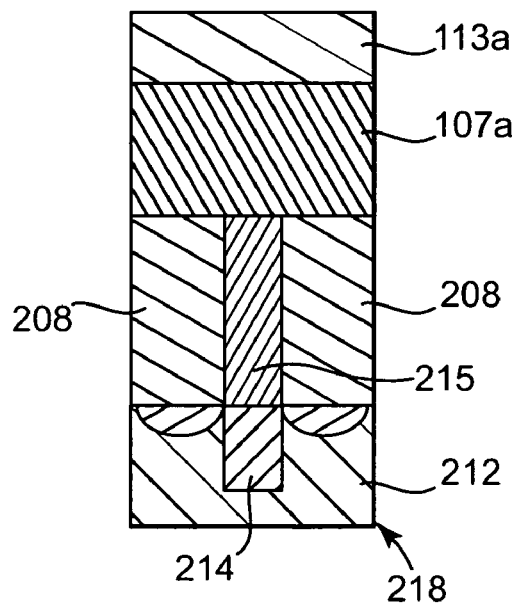
FIG. 6B illustrates a perpendicular cross-sectional view of the wafer illustrated in FIG. 6A.

FIG. 6A illustrates a cross-sectional view of one embodiment of preprocessed wafer 218, liner material layer 202, dielectric material layer 204b, a phase change material layer 107a, and an electrode material layer 113a. FIG. 6B illustrates a perpendicular cross-sectional view of the wafer illustrated in FIG. 6A. Phase change material, such as a chalcogenide compound material or other suitable phase change material, is deposited over exposed portions of dielectric material layer 204b, liner material layer 202, and preprocessed wafer 218 to provide phase change material layer 107a. Phase change material layer 107a is deposited using CVD, ALD, MOCVD, PVD, JVP, or other suitable deposition technique.

Electrode material, such as TiN, TaN, W, Al, Cu, TiSiN, TaSiN, or other suitable electrode material, is deposited over phase change material layer 107a to provide electrode material layer 113a. Electrode material layer 113a is deposited using CVD, ALD, MOCVD, PVD, JVP, or other suitable deposition technique.

Figure 7A:
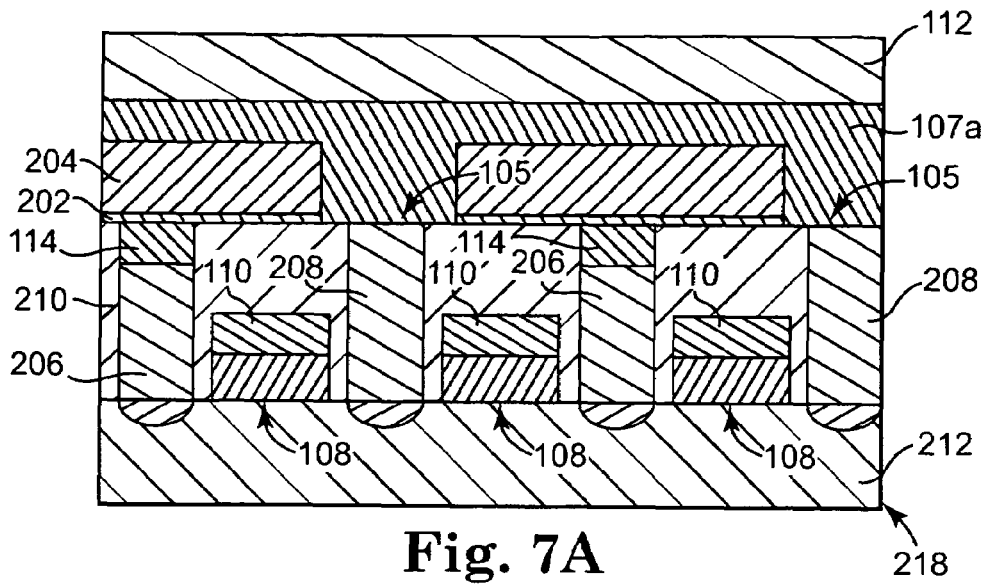
FIG. 7A illustrates a cross-sectional view of one embodiment of the preprocessed wafer, liner material layer, dielectric material layer, phase change material layer, and bit lines after etching.
Figure 7B:
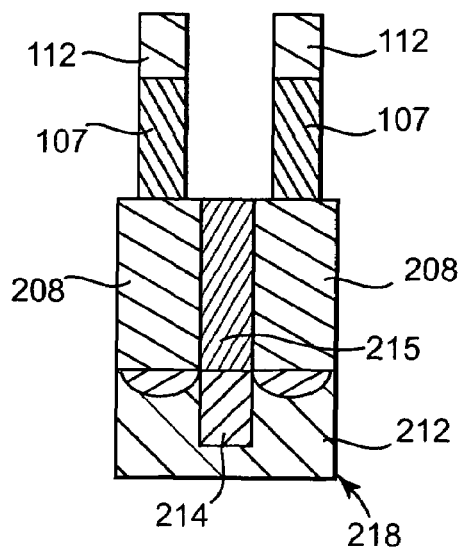
FIG. 7B illustrates a perpendicular cross-sectional view of the wafer illustrated in FIG. 7A.
Figure 7C:
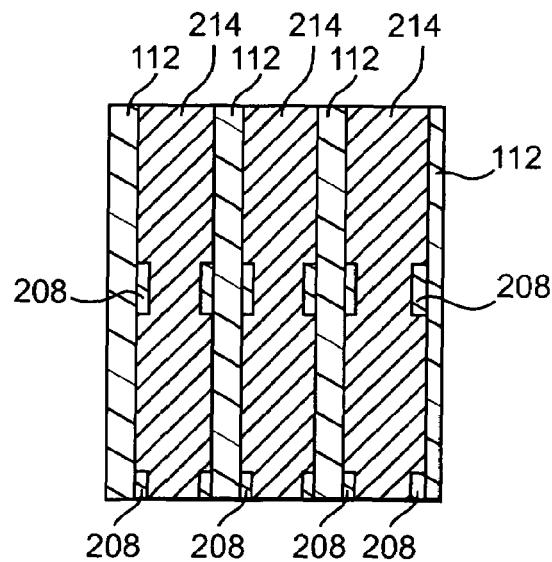
FIG. 7C illustrates a top view of the wafer illustrated in FIG. 7A.

FIG. 7A illustrates a cross-sectional view of one embodiment of preprocessed wafer 218, liner material layer 202, dielectric material layer 204, phase change material layer 107, and bit lines 112 after etching electrode material layer 113a, phase change material layer 107a, and dielectric material layer 204b. FIG. 7B illustrates a perpendicular cross-sectional view of the wafer illustrated in FIG. 7A, and FIG. 7C illustrates a top view of the wafer illustrated in FIG. 7A. Electrode material layer 113a, phase change material layer 107a, and dielectric material layer 204b are etched to provide bit lines 112, phase change material layer 107, which is self-aligned to bit lines 112, and dielectric material layer 204. In one embodiment, phase change material layer 107 is optionally undercut etched. Line lithography is used to pattern bit lines 112 and lines of phase change material 107 perpendicular to trenches 220 such that each storage location 105 in phase change material 107 contacts a second contact 208. The line lithography does not need to be precisely centered over second contacts 208 as long as the bottom portion of each storage location 105 in phase change material 107 contacts a second contact 208. In this way, the line lithography is less critical yet the desired memory cell size is obtained.

Dielectric material, such as $SiO_2$, FSG, BPSG, BSG, or other suitable dielectric material, is deposited over exposed portions of bit lines 112, phase change material layer 107, dielectric material layer 204, and preprocessed wafer 218. The dielectric material layer is deposited using CVD, ALD, MOCVD, PVD, JVP, HDP, or other suitable deposition technique. The dielectric material layer is planarized to expose bit lines 112 and provide dielectric material layer 216. The dielectric material layer is planarized using CMP or another suitable planarization technique to provide array of phase change memory cells 200a illustrated in FIGS. 2A-2C.

Figure 8A:
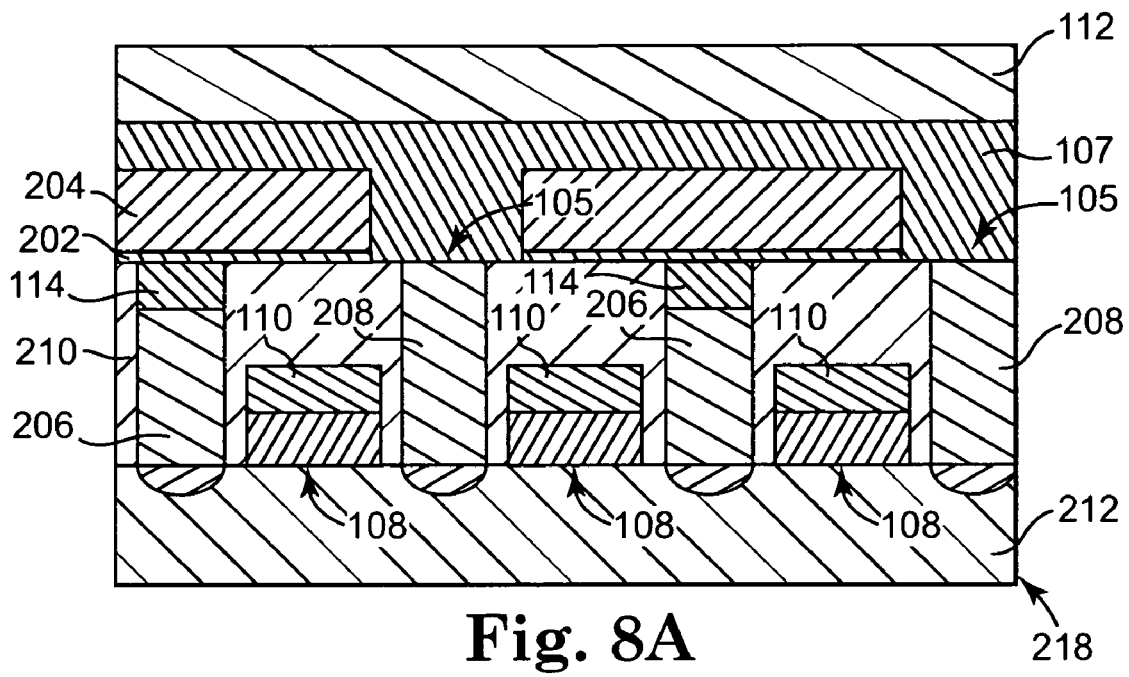
FIG. 8A illustrates a cross-sectional view of one embodiment of the preprocessed wafer, liner material layer, dielectric material layer, phase change material layer, and bit lines after over-etching.
Figure 8B:
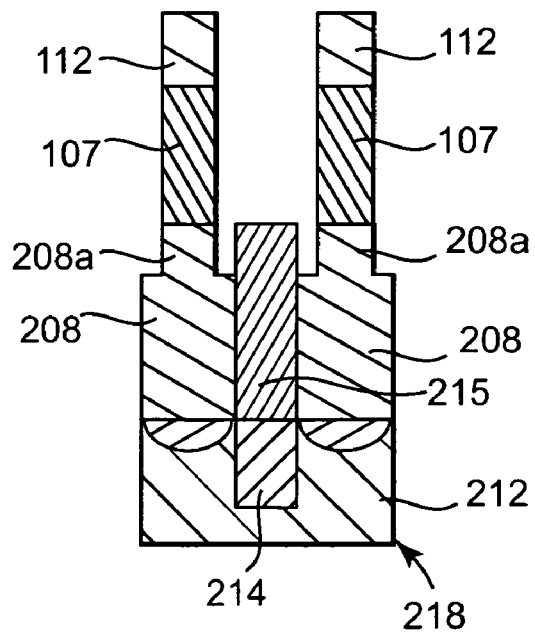
FIG. 8B illustrates a perpendicular cross-sectional view of the wafer illustrated in FIG. 8A.

FIG. 8A illustrates a cross-sectional view of one embodiment of preprocessed wafer 218, liner material layer 202, dielectric material layer 204, phase change material layer 107, and bit lines 112 after an optional over-etching of second contacts 208. FIG. 8B illustrates a perpendicular cross-sectional view of the wafer illustrated in FIG. 8A. Second contacts 208 are optionally over-etched to provide second contact portions 208a, which are self-aligned to bit lines 112.

Dielectric material, such as $SiO_2$, FSG, BPSG, BSG, or other suitable dielectric material, is deposited over exposed portions of bit lines 112, phase change material layer 107, dielectric material layer 204, second contact portions 208a, and preprocessed wafer 218. The dielectric material layer is deposited using CVD, ALD, MOCVD, PVD, JVP, HDP, or other suitable deposition technique. The dielectric material layer is planarized to expose bit lines 112 and provide dielectric material layer 216. The dielectric material layer is planarized using CMP or another suitable planarization technique to provide array of phase change memory cells 200a illustrated in FIGS. 2A-2C.

FIG. 9A illustrates a cross-sectional view of another embodiment of an array of phase change memory cells 200b. FIG. 9B illustrates a perpendicular cross-sectional view of array of phase change memory cells 200b illustrated in FIG. 9A. FIG. 9C illustrates a top view of array of phase change memory cells 200b illustrated in FIG. 9A. In one embodiment, array of phase change memory cells 100 is similar to array of phase change memory cells 200b. Array of phase change memory cells 200b includes substrate 212, transistors 108, word lines 110, first contacts 206, second contacts 208, ground lines 114, optional liner material 202, dielectric material 204, 210, and 216, STI 214, WLD 215, phase change elements 106, and bits lines 112. Metal wiring (not shown) follows after the bit line level.

Transistors 108 for selecting phase change elements 106 are formed in substrate 212 in rows and columns. The gates of transistors 108 are electrically coupled to word lines 110. Dielectric material 210 is deposited over transistors 108 and word lines 110. First contacts 206 electrically couple one side of the source-drain path of each transistor 108 to a ground line 114. Second contacts 208 electrically couple the other side of the source-drain path of each transistor 108 to a phase change element 106. Each phase change element 106 is electrically coupled to a bit line 112. Bit lines 112 are perpendicular to word lines 110 and ground lines 114. Liner material 202 and dielectric material 204 insulate ground lines 114 above first contacts 206. Dielectric material 216 insulates bits lines 112 and phase change elements 106 from adjacent bit lines 112 and phase change elements 106. STI 214 insulates transistors 108 from adjacent transistors 108, and ILD 215 insulates second contacts 208 from adjacent second contacts 208.

Phase change elements 106 are self-aligned to bit lines 112. The self-alignment minimizes critical lithography steps in the fabrication of array of phase change memory cells 200b. In addition, with self-alignment the interface resistances between second contacts 208 and phase change elements 106 and between phase change elements 106 and bit lines 112 is overlay insensitive and parasitic resistances are minimized.

In one embodiment, array of phase change memory cells 200b is scalable to 8 $F^2$ for dual gate memory cells, where "F" is the minimum feature size, or to 6 $F^2$ for single gate memory cells. In the embodiment for single gate memory cells, an active gate of a transistor 108 between every two adjacent memory cells is replaced with an isolation gate. A first embodiment of a method for fabricating array of phase change memory cells 200b is described and illustrated with reference to the following FIGS. 10A-15B. A second embodiment of a method for fabricating array of phase change memory cells 200b is described and illustrated with reference to the following FIGS. 16A-21C.

Figure 10A:
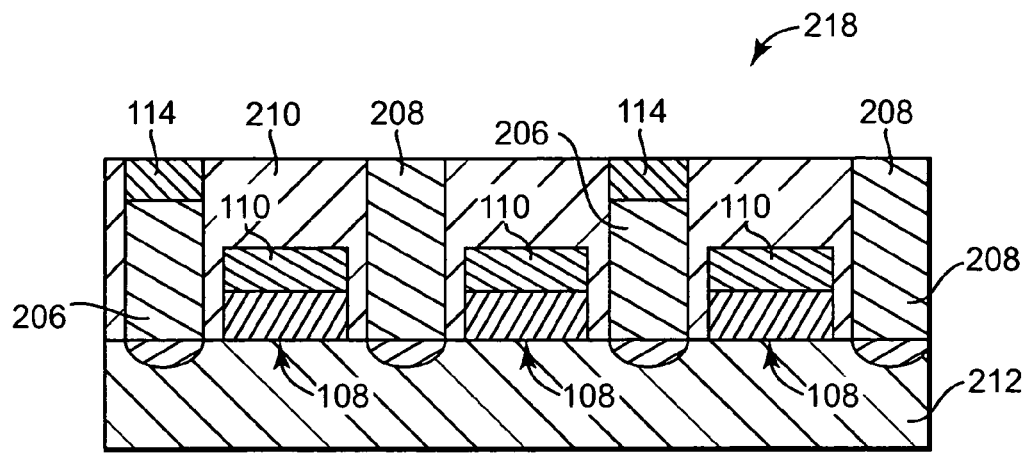
FIG. 10A illustrates a cross-sectional view of one embodiment of a preprocessed wafer.
Figure 10B:
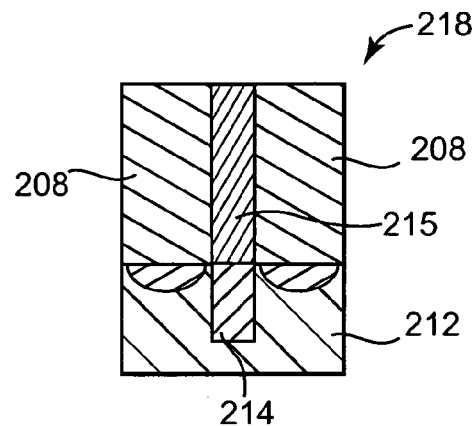
FIG. 10B illustrates a perpendicular cross-sectional view of the preprocessed wafer illustrated in FIG. 10A.
Figures 10C, 10D:
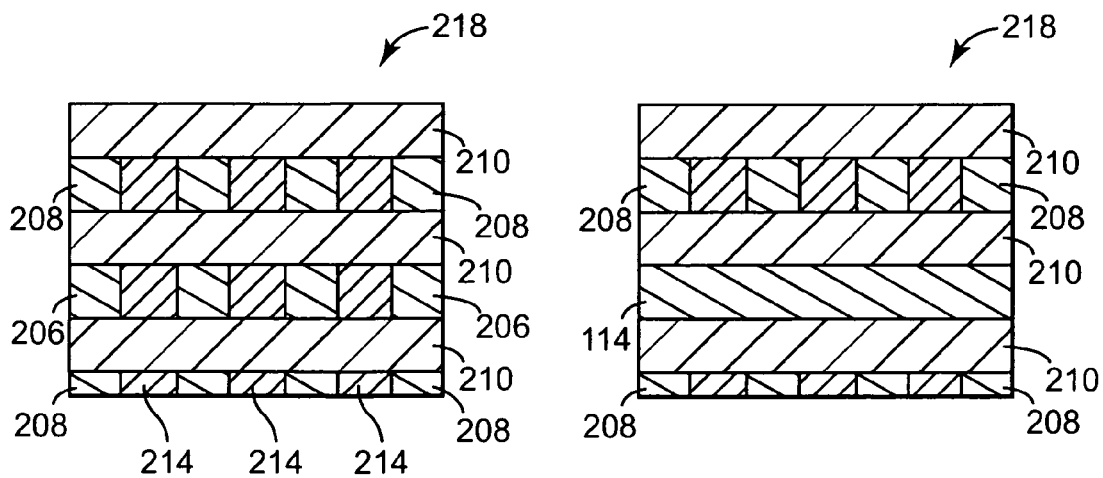
FIG. 10C illustrates a top cross-sectional view of the preprocessed wafer illustrated in FIG. 10A.
FIG. 10D illustrates a top view of the preprocessed wafer illustrated in FIG. 10A.

FIG. 10A illustrates a cross-sectional view of one embodiment of a preprocessed wafer 218. FIG. 10B illustrates a perpendicular cross-sectional view of preprocessed wafer 218 illustrated in FIG. 10A. FIG. 10C illustrates a top cross-sectional view of preprocessed wafer 218 illustrated in FIG. 10A. FIG. 10D illustrates a top view of preprocessed wafer 218 illustrated in FIG. 10A. Preprocessed wafer 218 includes substrate 212, transistors 108, word lines 110, first contacts 206, second contacts 208, ground lines 114, STI 214, WLD 215, and dielectric material 210.

Transistors 108 are formed in substrate 212 in row and columns. The gates of transistors 108 are electrically coupled to word lines 110. Dielectric material 210 is deposited over transistors 108 and word lines 110. First contacts 206 electrically couple one side of the source-drain path of each transistor 108 to a ground line 114. Second contacts 208 are electrically coupled to the other side of the source-drain path of each transistor 108. STI 214 insulates transistors 108 from adjacent transistors 108, and ILD 215 insulates second contacts 208 from adjacent second contacts 208.

First contacts 206 and second contacts 208 are contact plugs, such as W plugs, Cu plugs, or other suitable conducting material plugs. Word lines 110 comprise doped poly-Si, W, TiN, NiSi, CoSi, TiSi, $WSi_x$, or another suitable material. Ground lines 114 comprise W, Al, Cu, or other suitable material. Dielectric material 210 comprises SiN or other suitable material that enables a borderless contact formation process for first contacts 206 and second contacts 208. STI 214 and ILD 215 comprise $SiO_2$, FSG, BPSG, BSG, or other suitable dielectric material. Word lines 110 are parallel to ground lines 114. Word lines 110 and ground lines 114 are perpendicular to STI 214 and ILD 215.

Figure 11A:
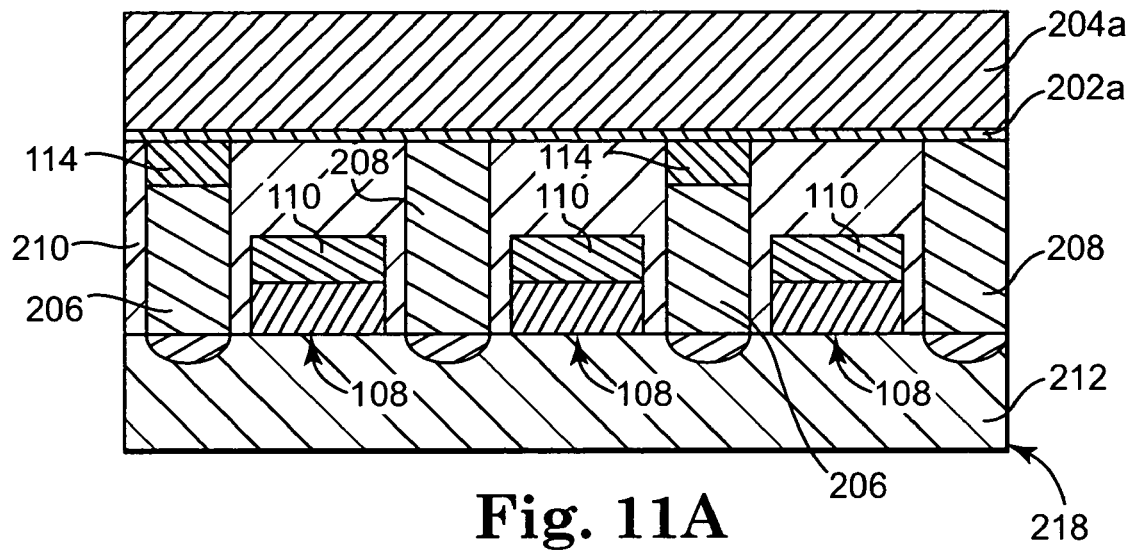
FIG. 11A illustrates a cross-sectional view of one embodiment of the preprocessed wafer, a liner material layer, and a dielectric material layer.
Figure 11B:
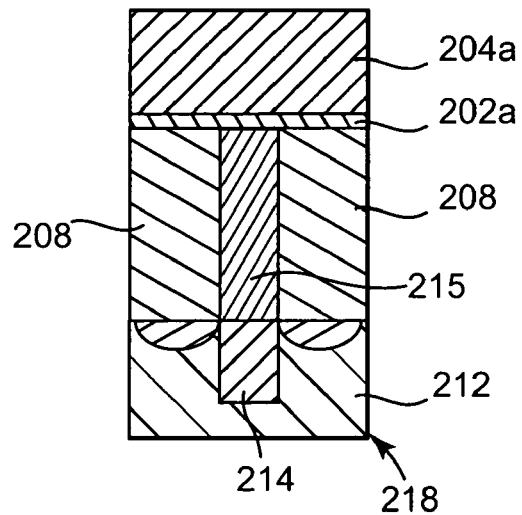
FIG. 11B illustrates a perpendicular cross-sectional view of the wafer illustrated in FIG. 11A.

FIG. 11A illustrates a cross-sectional view of one embodiment of preprocessed wafer 218, an optional liner material layer 202a, and a dielectric material layer 204a. FIG. 11B illustrates a perpendicular cross-sectional view of the wafer illustrated in FIG. 11A. Liner material, such as SiN or other suitable liner material, is optionally deposited over preprocessed wafer 218 to provide liner material layer 202a. Liner material layer 202a is deposited using CVD, ALD, MOCVD, PVD, JVP, HDP, or other suitable deposition technique.

Dielectric material, such as $SiO_2$, FSG, BPSG, BSG, or other suitable dielectric material, is deposited over liner material layer 202a to provide dielectric material layer 204a. Dielectric material layer 204a is deposited using CVD, ALD, MOCVD, PVD, JVP, HDP, or other suitable deposition technique.

Figure 12A:
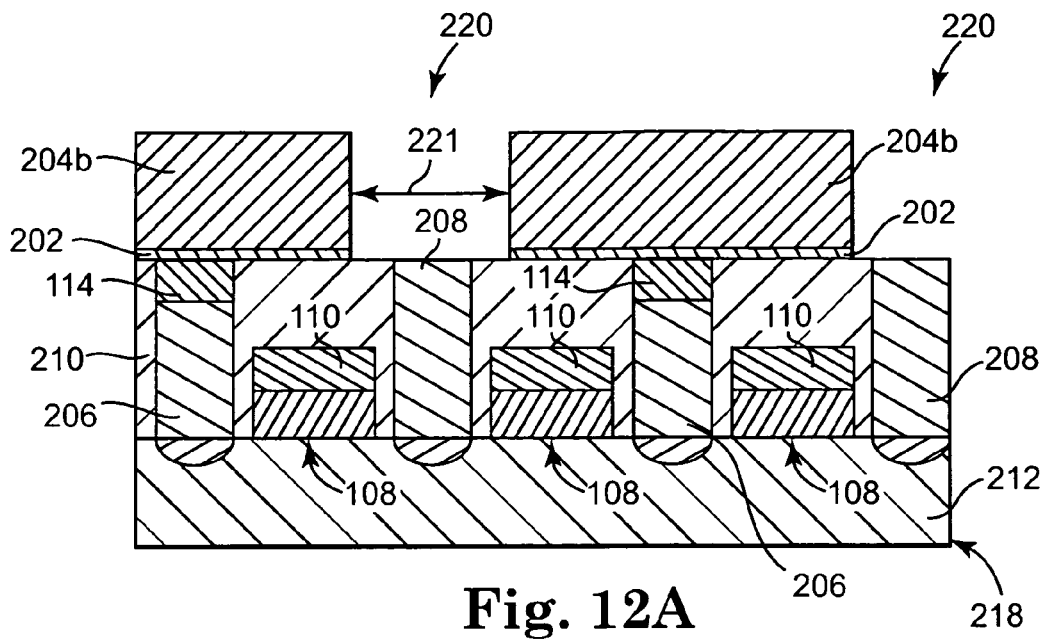
FIG. 12A illustrates a cross-sectional view of one embodiment of the preprocessed wafer, liner material layer, and dielectric material layer after etching.
Figure 12B:
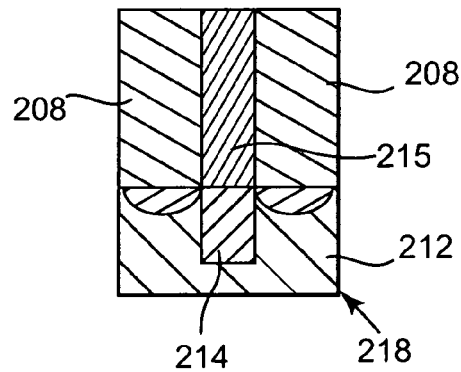
FIG. 12B illustrates a perpendicular cross-sectional view of the wafer illustrated in FIG. 12A.
Figure 12C:
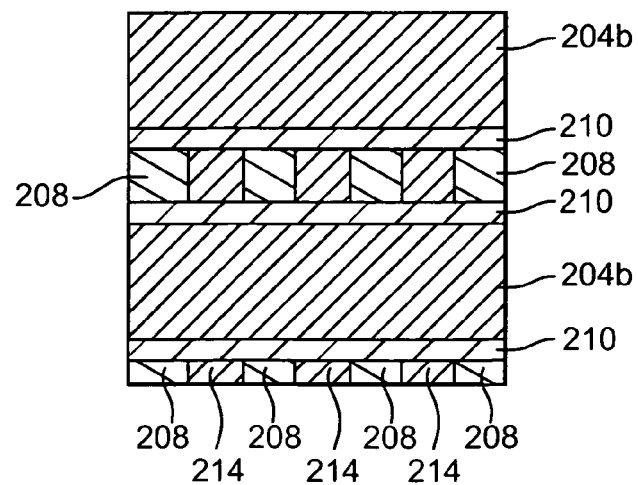
FIG. 12C illustrates a top view of the wafer illustrated in FIG. 12A.

FIG. 12A illustrates a cross-sectional view of one embodiment of preprocessed wafer 218, optional liner material layer 202, and dielectric material layer 204b after etching dielectric material layer 204a and liner material layer 202a. FIG. 12B illustrates a perpendicular cross-sectional view of the wafer illustrated in FIG. 12A, and FIG. 12C illustrates a top view of the wafer illustrated in FIG. 12A. Dielectric material layer 204a and liner material layer 202a are etched to provide dielectric material layer 204b and liner material layer 202 to form trenches 220. Line lithography is used to pattern trenches 220 having a width 221 to expose second contacts 208. In one embodiment, width 221 is less than the width of second contact 208. The line lithography does not need to be precisely centered over second contacts 208 as long as second contacts 208 are exposed. In this way, the line lithography is less critical yet the desired memory cell size is obtained.

Figure 13A:
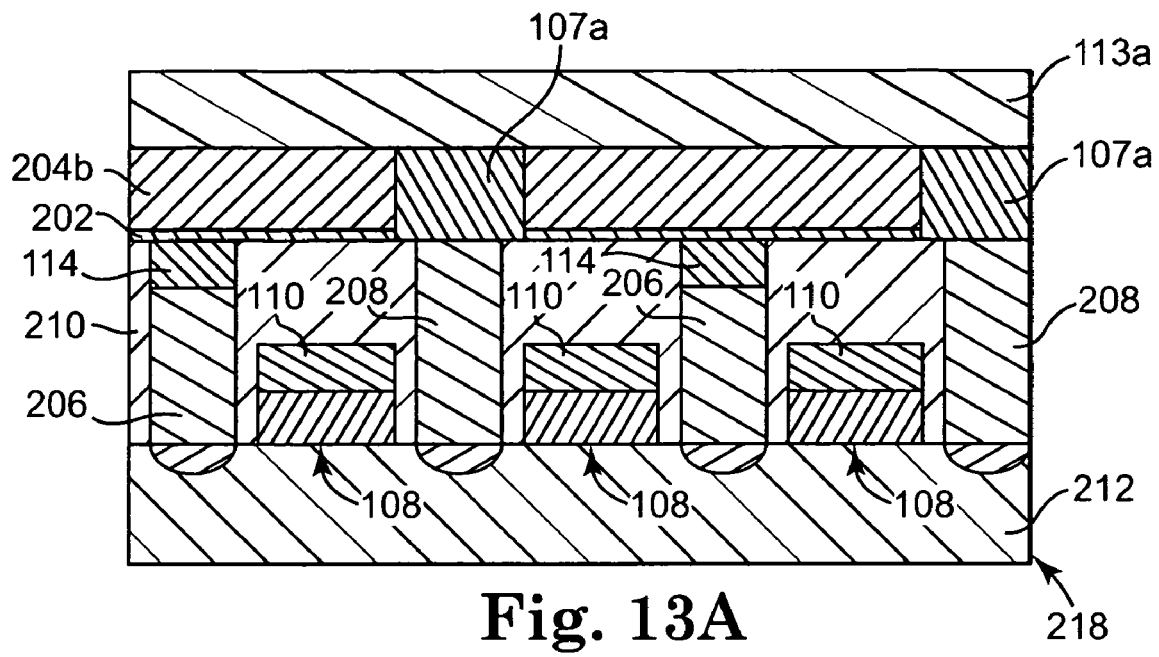
FIG. 13A illustrates a cross-sectional view of one embodiment of the preprocessed wafer, liner material layer, dielectric material layer, a phase change material layer, and an electrode material layer.
Figure 13B:
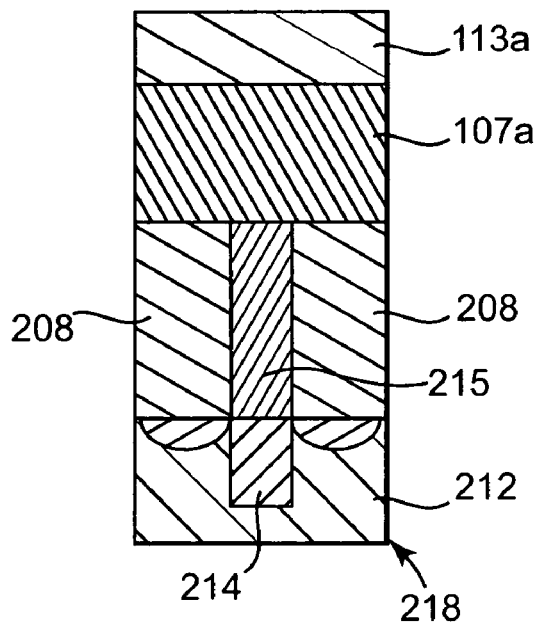
FIG. 13B illustrates a perpendicular cross-sectional view of the wafer illustrated in FIG. 13A.

FIG. 13A illustrates a cross-sectional view of one embodiment of preprocessed wafer 218, liner material layer 202, dielectric material layer 204b, a phase change material layer 107a, and an electrode material layer 113a. FIG. 13B illustrates a perpendicular cross-sectional view of the wafer illustrated in FIG. 13A. Phase change material, such as a chalcogenide compound material or other suitable phase change material, is deposited over exposed portions of dielectric material layer 204b, liner material layer 202, and preprocessed wafer 218 to provide a phase change material layer. The phase change material layer is deposited using CVD, ALD, MOCVD, PVD, JVP, or other suitable deposition technique. The phase change material layer is planarized to expose dielectric material layer 204b to provide phase change material layer 107a. The phase change material layer is planarized using CMP or other suitable planarization technique.

Electrode material, such as TiN, TaN, W, Al, Cu, TiSiN, TaSiN, or other suitable electrode material, is deposited over phase change material layer 107a and dielectric material layer 204b to provide electrode material layer 113a. Electrode material layer 113a is deposited using CVD, ALD, MOCVD, PVD, JVP, or other suitable deposition technique.

Figure 14A:
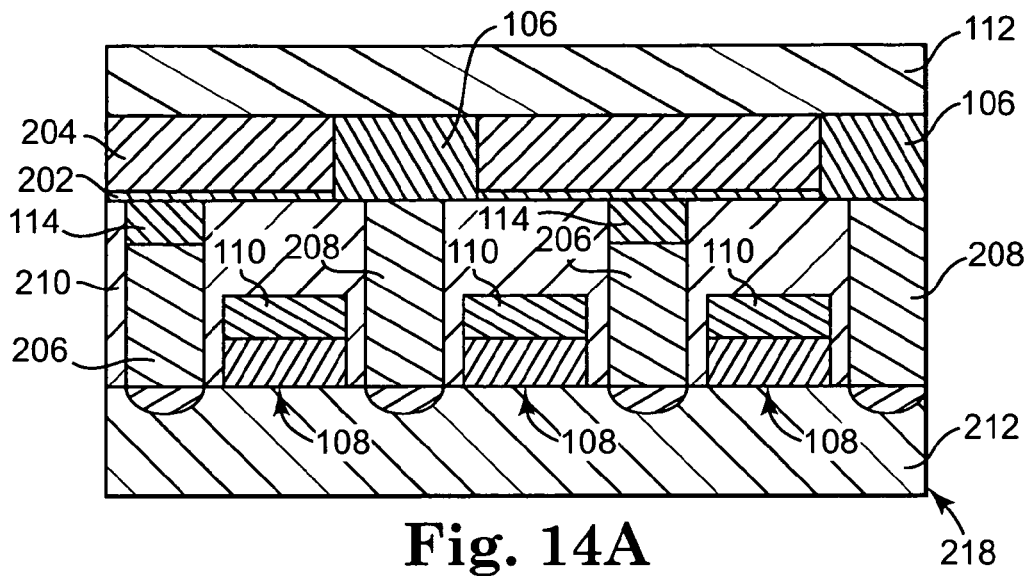
FIG. 14A illustrates a cross-sectional view of one embodiment of the preprocessed wafer, liner material layer, dielectric material layer, phase change elements, and bit lines after etching.
Figure 14B:
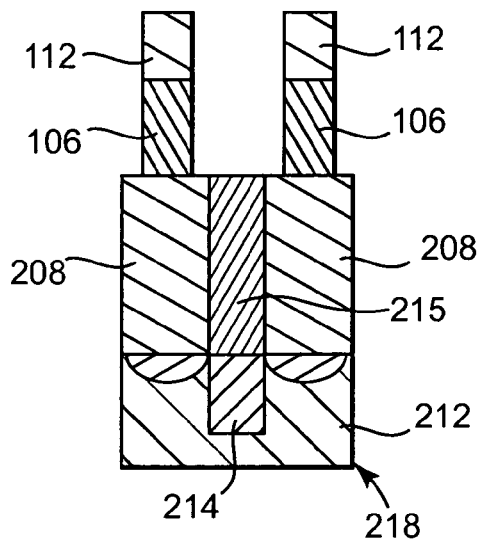
FIG. 14B illustrates a perpendicular cross-sectional view of the wafer illustrated in FIG. 14A.
Figure 14C:
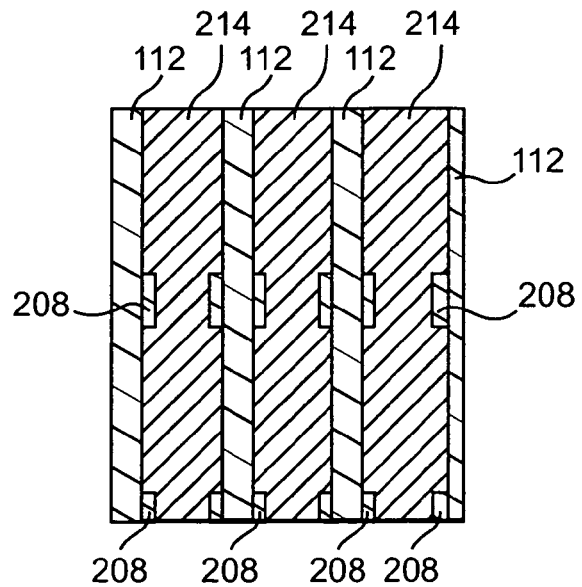
FIG. 14C illustrates a top view of the wafer illustrated in FIG. 14A.

FIG. 14A illustrates a cross-sectional view of one embodiment of preprocessed wafer 218, liner material layer 202, dielectric material layer 204, phase change elements 106, and bit lines 112 after etching electrode material layer 113a, phase change material layer 107a, and dielectric material layer 204b. FIG. 14B illustrates a perpendicular cross-sectional view of the wafer illustrated in FIG. 14A, and FIG. 14C illustrates a top view of the wafer illustrated in FIG. 14A. Electrode material layer 113a, phase change material layer 107a, and dielectric material layer 204b are etched to provide bit lines 112, phase change elements 106, which are self-aligned to bit lines 112, and dielectric material layer 204. In one embodiment, phase change elements 106 are optionally undercut etched. Line lithography is used to pattern bit lines 112 and phase change elements 106 perpendicular to trenches 220 such that each phase change element 106 contacts a second contact 208. The line lithography does not need to be precisely centered over second contacts 208 as long as the bottom portion of each phase change element 106 contacts a second contact 208. In this way, the line lithography is less critical yet the desired memory cell size is obtained.

Dielectric material, such as SiO$_2$, FSG, BPSG, BSG, or other suitable dielectric material, is deposited over exposed portions of bit lines 112, phase change elements 106, dielectric material layer 204, and preprocessed wafer 218. The dielectric material layer is deposited using CVD, ALD, MOCVD, PVD, JVP, HDP, or other suitable deposition technique. The dielectric material layer is planarized to expose bit lines 112 and provide dielectric material layer 216. The dielectric material layer is planarized using CMP or another suitable planarization technique to provide array of phase change memory cells 200b illustrated in FIGS. 9A-9C.

Figure 15A:
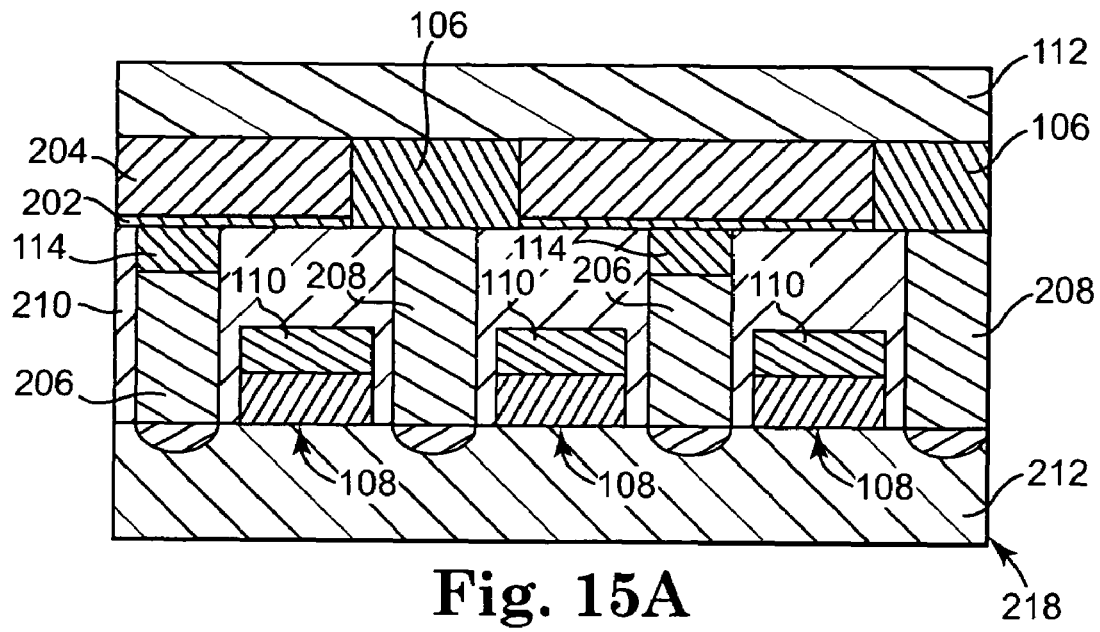
FIG. 15A illustrates a cross-sectional view of one embodiment of the preprocessed wafer, liner material layer, dielectric material layer, phase change elements, and bit lines after over-etching.
Figure 15B:
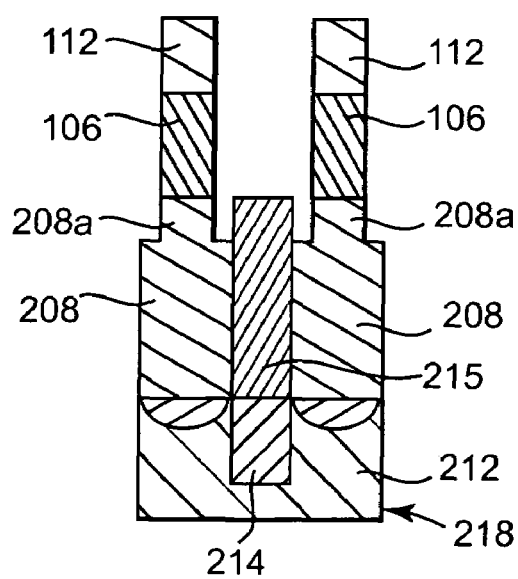
FIG. 15B illustrates a perpendicular cross-sectional view of the wafer illustrated in FIG. 15A.

FIG. 15A illustrates a cross-sectional view of one embodiment of preprocessed wafer 218, liner material layer 202, dielectric material layer 204, phase change elements 106, and bit lines 112 after an optional over-etching of second contacts 208. FIG. 15B illustrates a perpendicular cross-sectional view of the wafer illustrated in FIG. 15A. Second contacts 208 are optionally over-etched to provide second contact portions 208a, which are self-aligned to bit lines 112.

Dielectric material, such as SiO$_2$, FSG, BPSG, BSG, or other suitable dielectric material, is deposited over exposed portions of bit lines 112, phase change elements 106, dielectric material layer 204, second contact portions 208a, and preprocessed wafer 218. The dielectric material layer is deposited using CVD, ALD, MOCVD, PVD, JVP, HDP, or other suitable deposition technique. The dielectric material layer is planarized to expose bit lines 112 and provide dielectric material layer 216. The dielectric material layer is pla- narized using CMP or another suitable planarization technique to provide array of phase change memory cells 200b illustrated in FIGS. 9A-9C.

Figure 16A:
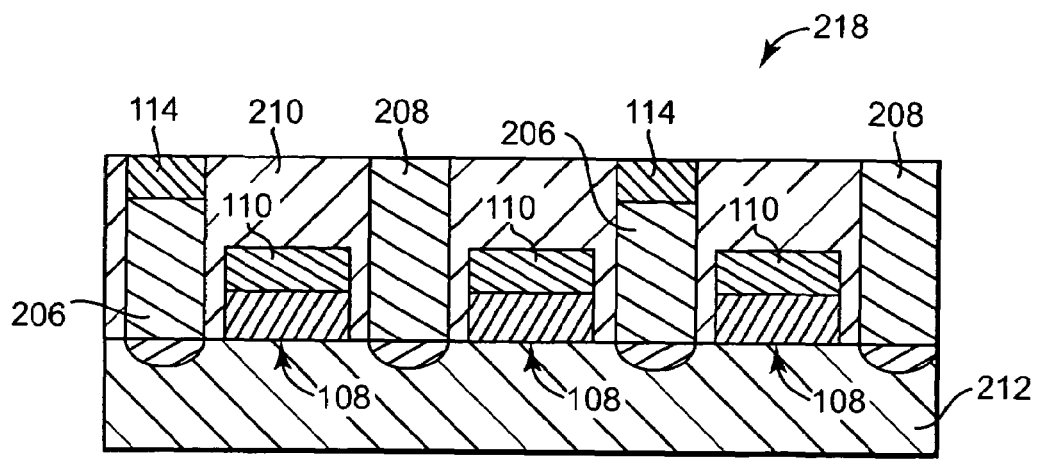
FIG. 16A illustrates a cross-sectional view of one embodiment of a preprocessed wafer.
Figure 16B:
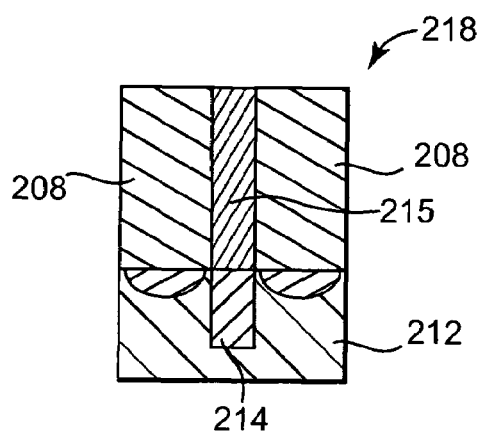
FIG. 16B illustrates a perpendicular cross-sectional view of the preprocessed wafer illustrated in FIG. 16A.
Figures 16C, 16D:
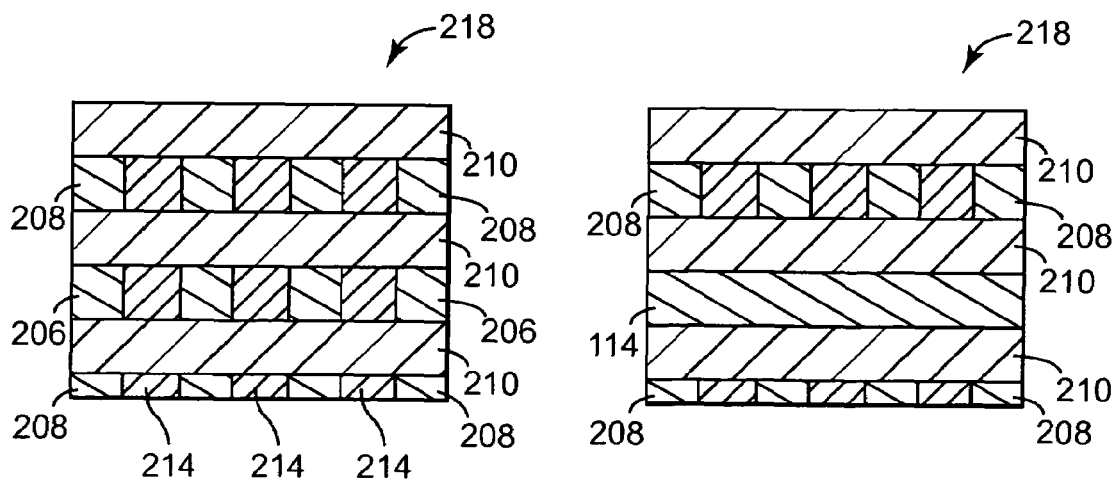
FIG. 16C illustrates a top cross-sectional view of the preprocessed wafer illustrated in FIG. 16A.
FIG. 16D illustrates a top view of the preprocessed wafer illustrated in FIG. 16A.

FIG. 16A illustrates a cross-sectional view of one embodiment of a preprocessed wafer 218. FIG. 16B illustrates a perpendicular cross-sectional view of preprocessed wafer 218 illustrated in FIG. 16A. FIG. 16C illustrates a top cross-sectional view of preprocessed wafer 218 illustrated in FIG. 16A. FIG. 16D illustrates a top view of preprocessed wafer 218 illustrated in FIG. 16A. Preprocessed wafer 218 includes substrate 212, transistors 108, word lines 110, first contacts 206, second contacts 208, ground lines 114, STI 214, ILD 215, and dielectric material 210.

Transistors 108 are formed in substrate 212 in row and columns. The gates of transistors 108 are electrically coupled to word lines 110. Dielectric material 210 is deposited over transistors 108 and word lines 110. First contacts 206 electrically couple one side of the source-drain path of each transistor 108 to a ground line 114. Second contacts 208 are electrically coupled to the other side of the source-drain path of each transistor 108. STI 214 insulates transistors 108 from adjacent transistors 108, and ILD 215 insulates second contacts 208 from adjacent second contacts 208.

First contacts 206 and second contacts 208 are contact plugs, such as W plugs, Cu plugs, or other suitable conducting material plugs. Word lines 110 comprise doped poly-Si, W, TiN, NiSi, CoSi, TiSi, WSi$_x$, or another suitable material. Ground lines 114 comprise W, Al, Cu, or other suitable material. Dielectric material 210 comprises SiN or other suitable material that enables a borderless contact formation process for first contacts 206 and second contacts 208. STI 214 and ILD 215 comprise SiO$_2$, FSG, BPSG, BSG, or other suitable dielectric material. Word lines 110 are parallel to ground lines 114. Word lines 110 and ground lines 114 are perpendicular to STI 214 and ILD 215.

Figure 17:
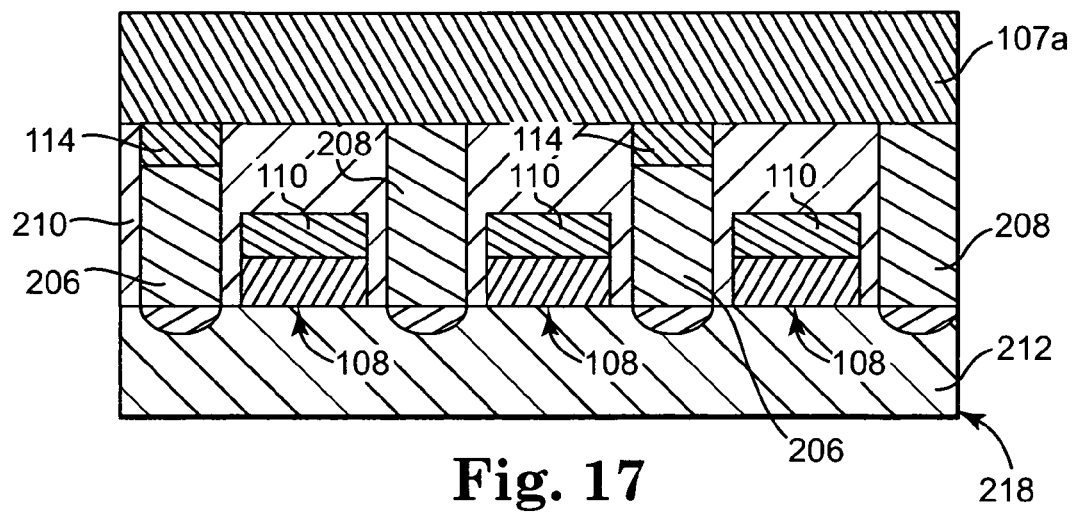
FIG. 17 illustrates a cross-sectional view of one embodiment of the preprocessed wafer and a phase change material layer.

FIG. 17 illustrates a cross-sectional view of one embodiment of preprocessed wafer 218 and a phase change material layer 107a. Phase change material, such as a chalcogenide compound material or other suitable phase change material, is deposited over preprocessed wafer 218 to provide phase change material layer 107a. Phase change material layer 107a is deposited using CVD, ALD, MOCVD, PVD, JVP, or other suitable deposition technique. In one embodiment, an optional hardmask material layer is deposited over first phase change material layer 107a.

Figure 18:
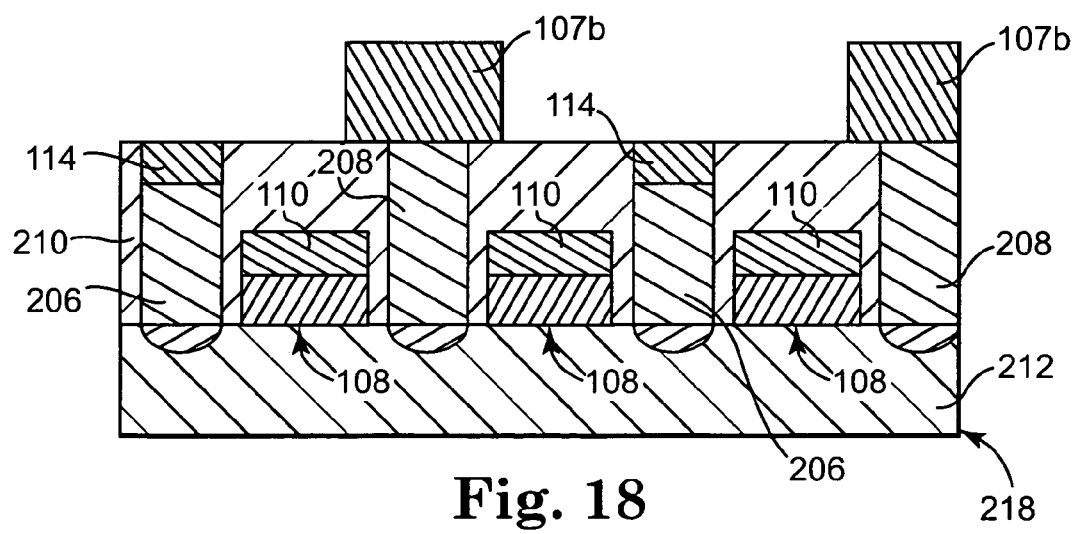
FIG. 18 illustrates a cross-sectional view of one embodiment of the preprocessed wafer and phase change material layer after etching.

FIG. 18 illustrates a cross-sectional view of one embodiment of preprocessed wafer 218 and phase change material layer 107b after etching phase change material layer 107a. Phase change material layer 107a is etched to provide phase change material layer 107b. Line lithography is used to pattern lines of phase change material 107b contacting second contacts 208. The line lithography does not need to be precisely centered over second contacts 208 as long as second contacts 208 are covered by phase change material 107b. In this way, the line lithography is less critical yet the desired memory cell size is obtained.

In the embodiment where a hardmask material layer is deposited over phase change material layer 107a, the hardmask material layer and phase change material layer 107a are etched to provide an etched hardmask material layer and phase change material layer 107b, which is self-aligned to the etched hardmask material layer.

Figure 19A:
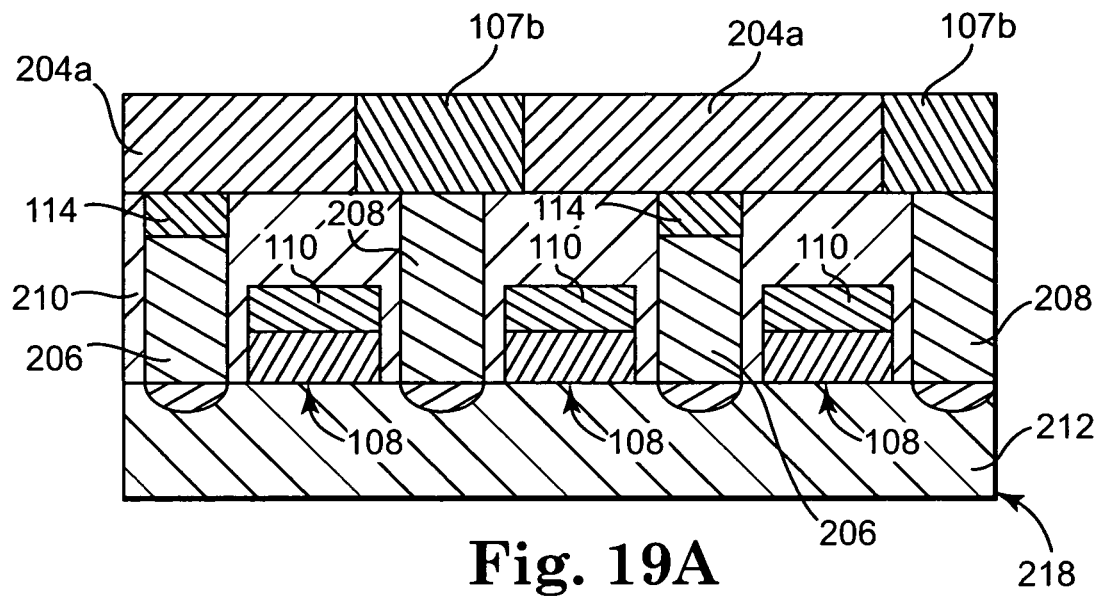
FIG. 19A illustrates a cross-sectional view of one embodiment of the preprocessed wafer, phase change material layer, and a dielectric material layer.
Figure 19B:
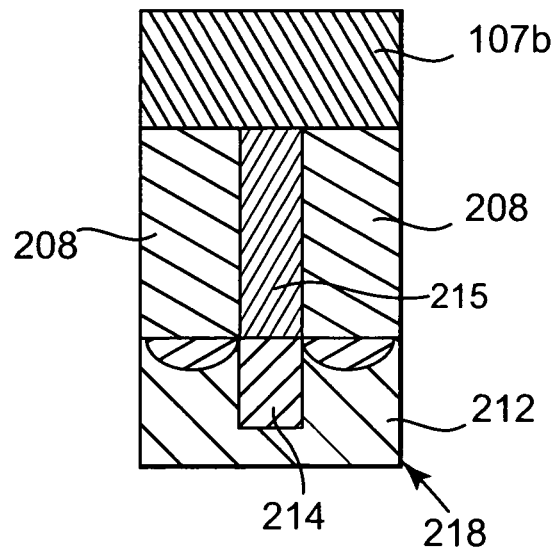
FIG. 19B illustrates a perpendicular cross-sectional view of the wafer illustrated in FIG. 19A.

FIG. 19A illustrates a cross-sectional view of one embodiment of preprocessed wafer 218, phase change material layer 107b, and a dielectric material layer 204a. FIG. 19B illustrates a perpendicular cross-sectional view of the wafer illustrated in FIG. 19A. Dielectric material, such as SiO$_2$, FSG, BPSG, BSG, or other suitable dielectric material, is deposited over exposed portions of phase change material layer 107b and preprocessed wafer 218. The dielectric material layer is deposited using CVD, ALD, MOCVD, PVD, JVP, HDP, or other suitable deposition technique. The dielectric material layer is planarized to expose phase change material layer 107b and provide dielectric material layer 204a. The dielectric material layer is planarized using CMP or another suitable planarization technique. In the embodiment where an etched hardmask material layer is over phase change material layer 107b, the dielectric material layer is planarized to expose the hardmask material. The planarized dielectric material layer is optionally recess etched such that the top of the dielectric material layer is aligned with the top of phase change material layer 107b. The hardmask material is then removed using a wet etch or other suitable technique.

Figure 20A:
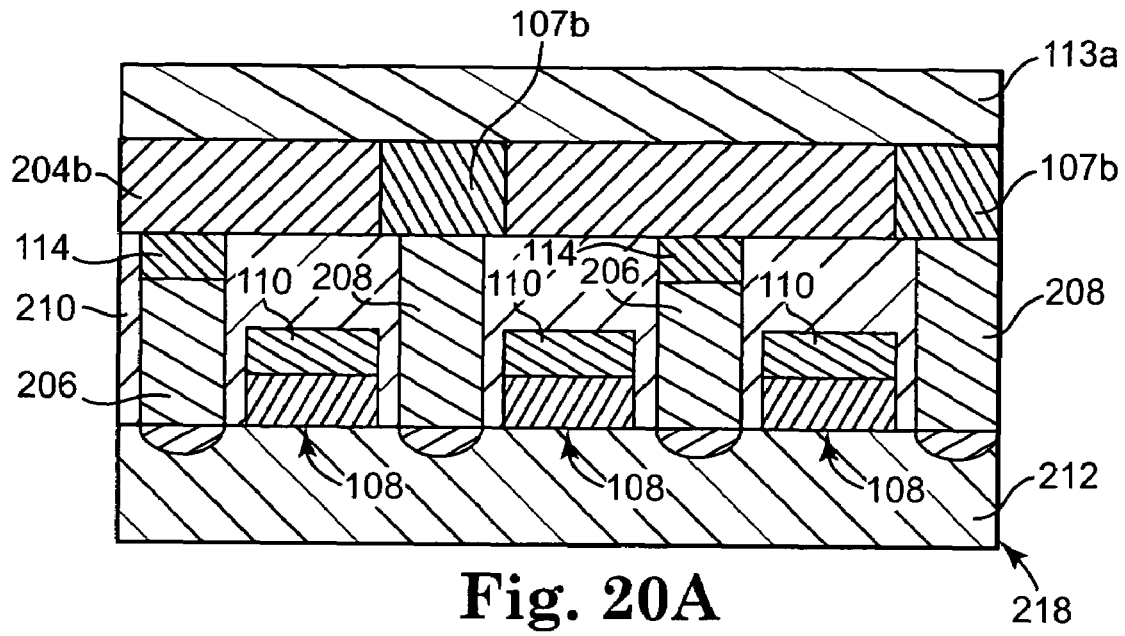
FIG. 20A illustrates a cross-sectional view of one embodiment of the preprocessed wafer, phase change material layer, dielectric material layer, and an electrode material layer.
Figure 20B:
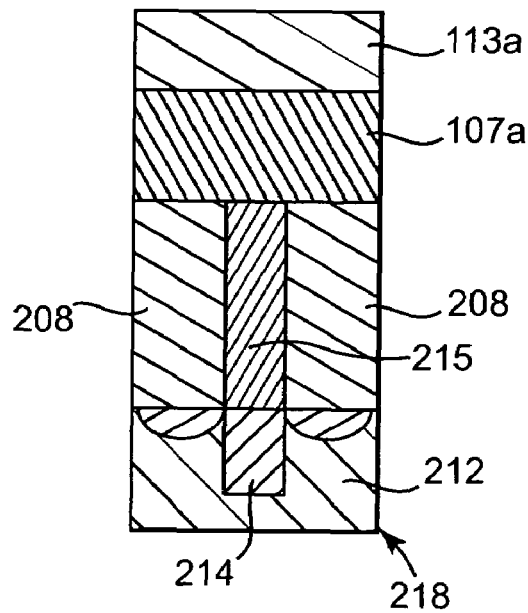
FIG. 20B illustrates a perpendicular cross-sectional view of the wafer illustrated in FIG. 20A.

FIG. 20A illustrates a cross-sectional view of one embodiment of preprocessed wafer 218, phase change material layer 107b, dielectric material layer 204a, and an electrode material layer 113a. FIG. 20B illustrates a perpendicular cross-sectional view of the wafer illustrated in FIG. 20A. Electrode material, such as TiN, TaN, W, Al, Cu, TiSiN, TaSiN, or other suitable electrode material, is deposited over phase change material layer 107b and dielectric material layer 204a to provide electrode material layer 113a. Electrode material layer 113a is deposited using CVD, ALD, MOCVD, PVD, JVP, or other suitable deposition technique.

Figure 21A:
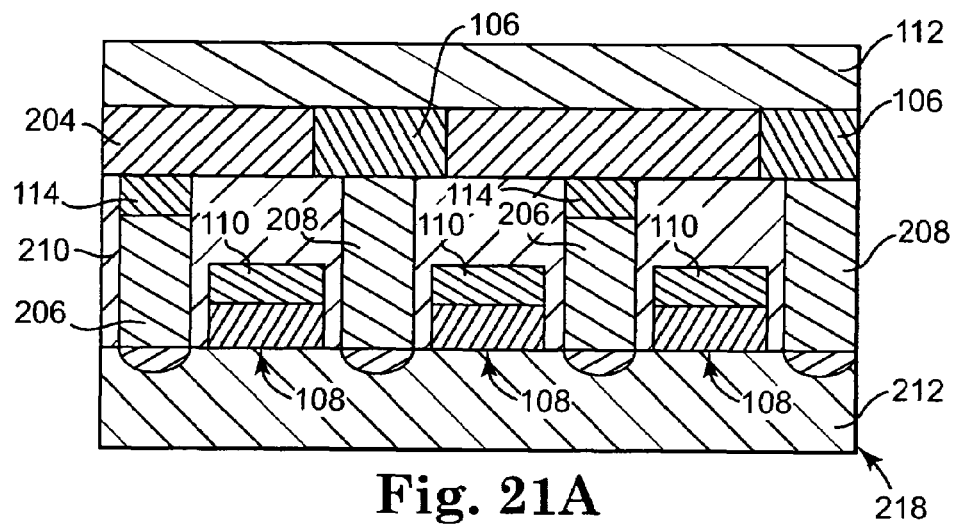
FIG. 21A illustrates a cross-sectional view of one embodiment of the preprocessed wafer, phase change elements, dielectric material layer, and bit lines after etching.
Figure 21B:
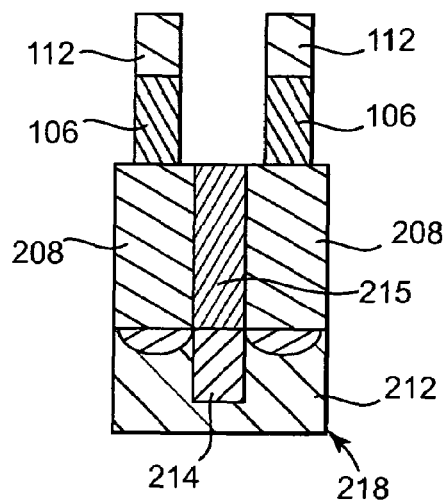
FIG. 21B illustrates a perpendicular cross-sectional view of the wafer illustrated in FIG. 21A.
Figure 21C:
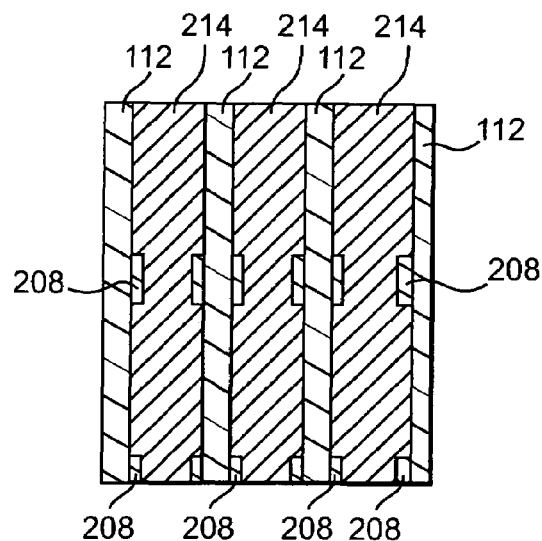
FIG. 21C illustrates a top view of the wafer illustrated in FIG. 21A.

FIG. 21A illustrates a cross-sectional view of one embodiment of preprocessed wafer 218, phase change elements 106, dielectric material layer 204, and bit lines 112 after etching electrode material layer 113a, phase change material layer 107b, and dielectric material layer 204a. FIG. 21B illustrates a perpendicular cross-sectional view of the wafer illustrated in FIG. 21A, and FIG. 21C illustrates a top view of the wafer illustrated in FIG. 21A. Electrode material layer 113a, phase change material layer 107b, and dielectric material layer 204a are etched to provide bit lines 112, phase change elements 106, which are self-aligned to bit lines 112, and dielectric material layer 204. In one embodiment, phase change elements 106 are optionally undercut etched. Line lithography is used to pattern bit lines 112 and phase change elements 106 perpendicular to lines of phase change material 107b such that each phase change element 106 contacts a second contact 208. The line lithography does not need to be precisely centered over second contacts 208 as long as the bottom portion of each phase change element 106 contacts a second contact 208. In this way, the line lithography is less critical yet the desired memory cell size is obtained.

Dielectric material, such as $SiO_2$, FSG, BPSG, BSG, or other suitable dielectric material, is deposited over exposed portions of bit lines 112, phase elements 106, dielectric material layer 204, and preprocessed wafer 218. The dielectric material layer is deposited using CVD, ALD, MOCVD, PVD, JVP, HDP, or other suitable deposition technique. The dielectric material layer is planarized to expose bit lines 112 and provide dielectric material layer 216. The dielectric material layer is planarized using CMP or another suitable planarization technique to provide array of phase change memory cells 200b illustrated in FIGS. 9A-9C.

Embodiments of the present invention provide an array of phase change memory cells fabricated using line lithography and self-aligned processing to minimize critical lithography steps. In addition, interface resistances between metal and active material in the array is overlay-insensitive and by maximizing the interface areas, parasitic resistances are minimized. The array of phase change memory cells has an improved chemical mechanical planarization (CMP) process window and improved mechanical stability during fabrication.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory comprising:
   transistors in rows and columns providing an array;
   bit lines in columns across the array;
   contact elements; and
   resistive memory elements in direct contact with the bit lines and contacting the contact elements, at least a portion of each contact element self-aligned to a bit line such that a width of self-aligned portion substantially corresponds to a width of the bit line.

2. The memory of claim 1, further comprising:
   ground lines in rows across the array, each ground line coupled to one side of a source-drain path of the transistors in each row,
   wherein each resistive memory element is coupled to the other side of the source-drain path of each transistor.

3. The memory of claim 1, further comprising:
   word lines in rows across the array, each word line coupled to gates of the transistors in each row.

4. The memory of claim 1, wherein the memory is scalable to $6F^2$, where F is a minimum feature size.

5. The memory of claim 1, wherein the memory is scalable to $8F^2$, where F is a minimum feature size.

6. A memory comprising:
   transistors in rows and columns providing an array;
   bit lines in columns across the array;
   contact elements; and
   resistivity changing material in columns across the array and providing storage locations, the resistivity changing material in direct contact with the bit lines and contacting the contact elements, at least a portion of each contact element self-aligned to a bit line such that a width of the self-aligned portion substantially corresponds to a width of the bit line.

7. The memory of claim 6, further comprising:
   ground lines in rows across the array, each ground line coupled to one side of a source-drain path of the transistors in each row,
   wherein each storage location is coupled to the other side of the source-drain path of each transistor.

8. The memory of claim 6, further comprising:
   word lines in rows across the array, each word line coupled to gates of the transistors in each row.

9. The memory of claim 6, wherein the memory is scalable to $6F^2$, where F is a minimum feature size.

10. The memory of claim 6, wherein the memory is scalable to $8F^2$, where F is a minimum feature size.

11. The memory of claim 1, wherein the resistive memory elements comprise phase change elements.

12. The memory of claim 6, wherein the resistivity changing material comprises phase change material.

13. A memory comprising:
   transistors in rows and columns providing an array;
   bit lines in columns across the array; and resistive memory elements arranged between the bit lines and contact elements, at least a portion of each contact element self-aligned to a bit line such that a width of the self-aligned portion substantially corresponds to a width of the bit line, wherein the memory is scalable to $6F^2$ or $8F^2$, where F is a minimum feature size.

* * * * *